United States Patent
Sato et al.

(10) Patent No.: US 8,177,048 B2
(45) Date of Patent: May 15, 2012

(54) VACUUM PROCESSING APPARATUS

(75) Inventors: Yushi Sato, Ise (JP); Toshio Miki, Ise (JP); Yosuke Muraguchi, Ise (JP); Katsumi Yasuda, Ise (JP); Kazunari Kitaji, Ise (JP); Yasushi Muragishi, Ise (JP); Minoru Maeda, Ise (JP)

(73) Assignee: Sinfonia Technology Co., Ltd., Tokyo (JP)

( * ) Notice: Subject to any disclaimer, the term of this patent is extended or adjusted under 35 U.S.C. 154(b) by 490 days.

(21) Appl. No.: 12/536,735

(22) Filed: Aug. 6, 2009

(65) Prior Publication Data

US 2010/0036523 A1   Feb. 11, 2010

(30) Foreign Application Priority Data

Aug. 7, 2008   (JP) .................................. 2008-204826

(51) Int. Cl.
*H01L 21/677* (2006.01)

(52) U.S. Cl. ...................... 198/619; 414/217.1; 414/939; 307/104; 74/490.02; 74/490.03

(58) Field of Classification Search .................. 198/619; 414/217.1, 935–941; 307/104; 74/490.02, 74/490.03
See application file for complete search history.

(56) References Cited

U.S. PATENT DOCUMENTS

| | | | | |
|---|---|---|---|---|
| 6,935,828 | B2* | 8/2005 | Ackeret et al. | 414/217 |
| 7,825,544 | B2* | 11/2010 | Jansen et al. | 307/104 |
| 7,841,820 | B2* | 11/2010 | Bonora et al. | 414/217.1 |
| 7,988,398 | B2* | 8/2011 | Hofmeister et al. | 414/217 |

FOREIGN PATENT DOCUMENTS

| | | |
|---|---|---|
| JP | 6-155366 | 6/1994 |
| JP | 6-179524 | 6/1994 |
| JP | 2003-319666 | 11/2003 |
| JP | 2003-332404 | 11/2003 |

* cited by examiner

*Primary Examiner* — Mark A Deuble
(74) *Attorney, Agent, or Firm* — Oblon, Spivak, McClelland, Maier & Neustadt, L.L.P.

(57) ABSTRACT

A vacuum processing apparatus includes a vacuum chamber capable of keeping a first pressure lower than an atmospheric pressure, a driving source disposed in the vacuum chamber, an electric power supply mechanism including a primary side mechanism disposed outside the vacuum chamber for supplying electric power to the driving source and a secondary side mechanism disposed in the vacuum chamber for receiving the electric power from the primary side mechanism in a contactless relationship, and a vessel capable of accommodating airtightly the secondary side mechanism under a second pressure higher than the first pressure.

11 Claims, 28 Drawing Sheets

FIG. 5
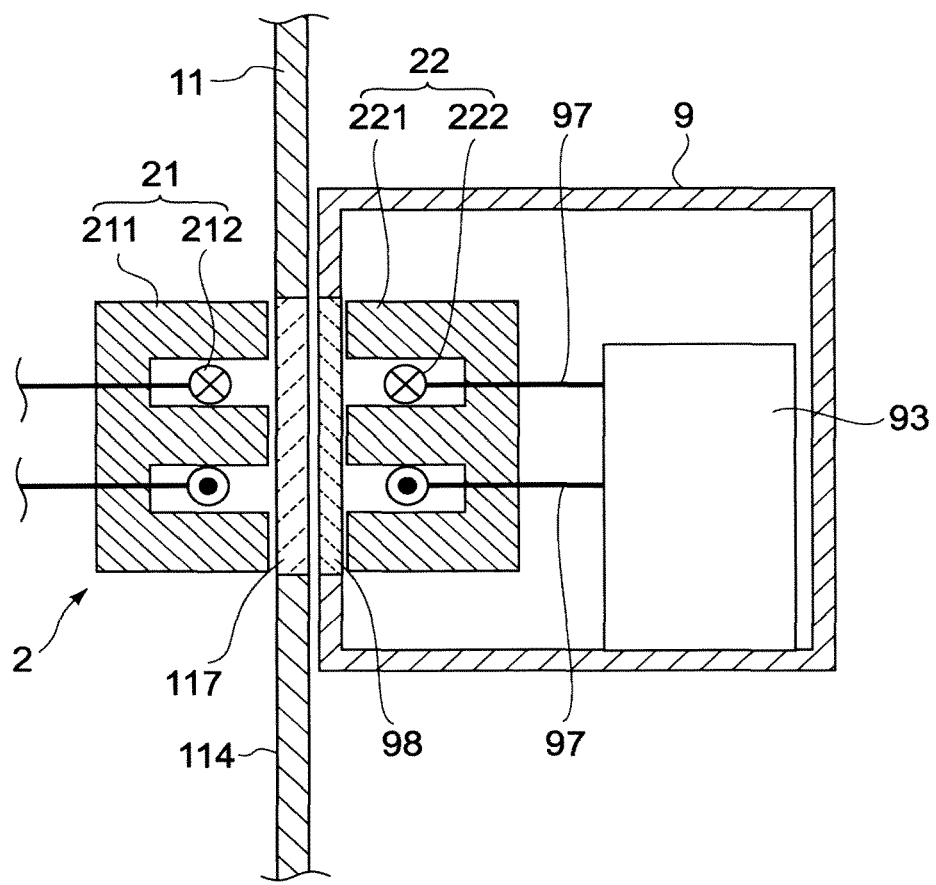
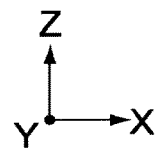

VACUUM PROCESSING APPARATUS

BACKGROUND OF THE INVENTION

1. Field of the Invention

This invention relates to a vacuum processing apparatus which transports a processing object such as a semiconductor wafer substrate or a glass substrate or carries out some other processing for the processing object in a vacuum chamber.

2. Description of the Related Art

Conventionally, as an apparatus for transporting a transport object such as a semiconductor substrate, an apparatus has been proposed which includes a transport table which can be moved by a linear motor in a vacuum vessel. The transport apparatus within a vacuum vessel includes an armature including a core and a coil and disposed for movement along a wall face of the vacuum vessel outside the vacuum vessel and a secondary magnetic pole connected to the transport table in the vacuum vessel (refer to, for example, FIG. 1 of Japanese Patent Laid-open No. 2003-332404).

SUMMARY OF THE INVENTION

Incidentally, where power is supplied, for example, to a driving system for a transport table within such a vacuum vessel as described above, power is generally supplied from a power supply provided outside the vacuum vessel to a driver of the driving system through an electric cable. However, if such a cable as just described or a like member is placed in the vacuum vessel, then gas is generated from resin or a like material for coating used in the cable. The gas generated has a bad influence on a processing object such as a transport object.

On the other hand, it seems a promising idea to cover an electric cable or a like member extending from a power supply with a cable duct of an airtight structure within a vacuum vessel and place the inside of the cable duct into an atmospheric pressure state to solve the problem of generation of gas described above. In this instance, since the cable duct is provided so as to extend between the fixed side of a partition wall which composes the vacuum vessel and the movable side of a moving body, the cable duct must be formed adopting a structure which allows contraction and expansion thereof such as a structure which allows movement thereof, for example, like a bellows or an arm structure. Therefore, the shielding property between the inside and the outside of the cable duct is significant, and the structure is complicated.

Therefore, it is desirable to provide a vacuum processing apparatus which eliminates the problem of generation of gas from a cable or a like member and can supply power to a driving source in a vacuum vessel without using a complicated structure such as a movable cable duct or a like member.

According to an embodiment of the present invention, there is provided a vacuum processing apparatus including a vacuum chamber, a driving source, an electric power supply mechanism, and a vessel. The vacuum chamber is capable of keeping a first pressure lower than an atmospheric pressure. The driving source is disposed in the vacuum chamber. The electric power supply mechanism includes a primary side mechanism disposed outside the vacuum chamber for supplying electric power to the driving source and a secondary side mechanism disposed in the vacuum chamber for receiving the electric power from the primary side mechanism in a contactless relationship. The vessel is capable of airtightly accommodating the secondary side mechanism under a second pressure higher than the first pressure.

In the vacuum processing apparatus, the primary side mechanism of the power supply mechanism is disposed outside the vacuum chamber which is the higher pressure side than the first pressure, and the secondary side mechanism in the vacuum chamber receives electric power in a contactless relationship from the primary side mechanism. Therefore, electric power can be supplied from the outside of the vacuum chamber to the driving source in the inside of the vacuum chamber without using an electric cable, and there is no necessity to adopt such a complicated structure as a movable cable duct or the like. Since the secondary side mechanism is accommodated in the vessel which has, in the inside thereof, an atmosphere of the second pressure which is comparatively high, for example, even if an electric cable connected to extend from the secondary side mechanism to the driving source is disposed in the vessel, the problem of generation of gas can be solved.

The second pressure is typically an atmospheric pressure. However, the second pressure may be higher or lower than the atmospheric pressure only if the second pressure does not have a bad influence on the secondary side mechanism.

Although the vessel typically has air accommodated therein, some other gas may be accommodated in the vessel. The gas in the vessel may be same as or different from the gas in the vacuum chamber.

The vacuum processing apparatus may further include a processing unit for processing a processing object with power by the driving source. In this instance, the driving source may be a controller accommodated in the vessel for controlling the processing unit. In the vacuum processing apparatus, since the controller is accommodated in the vessel similarly to the secondary side mechanism, for example, a circuit board, circuit elements and so forth included in the controller are not exposed to the vacuum, and an otherwise possible bad influence on the components of the controller can be prevented. Also an electric cable which connects the secondary side mechanism and the controller to each other can be accommodated in the vessel, and generation of gas can be prevented.

The processing unit is typically a transport robot for transporting a processing object. However, it can be applied to any processing unit which carries out processing for a processing object under the vacuum such as plasma processing.

The vacuum processing apparatus may be configured such that the vacuum chamber has a partition wall for defining the inside and the outside of the vacuum chamber and the partition wall has a transmitting member provided at least at a position thereof, through which the primary side mechanism and the secondary side mechanism are opposed to each other, for transmitting energy of the electric power, which is to be transmitted from the primary side mechanism to the secondary side mechanism, therethrough.

Where the power supply mechanism uses an induced magnetic field to supply the electric power from the primary side mechanism to the secondary side mechanism, the transmitting member must only be formed from a non-magnetic substance.

The power supply mechanism may use an induced magnetic field to supply the electric power from the primary side mechanism to the secondary side mechanism. In this instance, both of the primary side mechanism and the secondary side mechanism may be configured including a core and a coil. Since the primary side mechanism is disposed outside the vacuum chamber and the secondary side mechanism is accommodated in the vessel whose internal pressure is the second pressure, it is possible to prevent gas from being generated from varnish for insulation, a resin mold and so forth included in the primary and secondary side mechanisms.

The vacuum processing apparatus may further include a movable body integrally movable with the vessel, and the driving source may drive the moving body. The moving body may have a transport robot. Since a transport robot has a range of movement greater than that of the other processing apparatus, the contactless power supply mechanism makes effective means. In this instance, the driving source may be a controller for controlling the movable body to move in a predetermined direction or may be a controller for controlling the moving body to move in a predetermined movement.

The primary side mechanism may extend along a direction of the movement of the moving body. Where the primary side mechanism is disposed in this manner, electric power can be supplied continuously and stably to the driving source for driving the moving body.

A plurality of such primary side mechanisms may be disposed intermittently along a direction of the movement of the moving body. Where the plural primary side mechanism are disposed in this manner, the cost required for a primary side electromagnet and the transmitting member can be reduced in comparison with an alternative case wherein the primary side mechanism extends along the direction of movement of the moving body as described above.

For example, where a construction is disposed outside the partition wall, the plural primary side mechanisms may be disposed keeping away from the construction. Or, where the moving body has a transport robot, the plural primary side mechanisms may be disposed keeping away from the transfer location of a transport object by the transport robot.

At least one of the plural primary side mechanisms may be disposed at a position corresponding to a home position of the moving body. Since the period of time within which the moving body stands by at the home position is comparatively long, where at least one of the plural primary side mechanisms is disposed at the position corresponding to the home position of the moving body, electric power is supplied efficiently to the driving source.

Where the moving body has a transport robot, at least one of the plural primary side mechanisms may be disposed not only at the position corresponding to the home position but also, for example, at a position corresponding to a transfer position of a processing object to or from a different processing apparatus connected to the vacuum processing apparatus.

A vacuum processing apparatus according to another embodiment of the present invention includes a heat generating source, a vacuum chamber, a vessel and a cooling mechanism. The vacuum chamber is capable of keeping a first pressure lower than an atmospheric pressure. The vessel is disposed in the vacuum chamber and airtightly accommodates the heating generating source under a second pressure higher than the first pressure. The cooling mechanism cools the vessel by thermal conduction. Here, although the second pressure typically is an atmospheric pressure, it may be higher or lower than the atmospheric pressure only if it does not have a bad influence on the heat generating source. Although the vessel typically has air accommodated therein, some other gas may be accommodated in the vessel. The gas in the vessel may be same as or different from the gas in the vacuum chamber. The heat generating source is, for example, a circuit board and a semiconductor part, a coil and so forth of circuit devices and so forth. However, the heat generating source is not limited to any of them.

With the vacuum processing apparatus described, the vessel in which the heat generating source is airtightly accommodated under the second pressure in the vacuum chamber is cooled by the cooling mechanism. Accordingly, by radiating heat generated from the heat generating source in the vessel to the outside of the vacuum chamber, failure of a part such as a circuit board or the like which act as the heat generating source in the vessel by heat and occurrence of some other fault with the part can be prevented.

In the vacuum processing apparatus, the cooling apparatus may include a thermal conductor, a cooling section and a thermal conductor driving section. The cooling section cools the thermal conductor. The thermal conductor driving section drives the cooled thermal conductor so as to be contacted with the vessel. Here, the thermal conductor is, for example, a metal block or a Peltier element. However, the thermal conductor is not limited to any of them. Meanwhile, the cooling section is an air cooling apparatus such as a fan, a water cooling apparatus, a heat pipe, a heat sink, a cryopump or the like. However, the cooling section is not limited to any of them.

With the configuration described, since the thermal conductor cooled by the cooling section is contacted with the vessel by the thermal conductor driving section, the vessel can be cooled by thermal conduction.

In the vacuum processing apparatus, the vacuum chamber may have a partition wall for defining the inside and the outside of the vacuum chamber. In this instance, the cooling mechanism may include a bellows connected to the thermal conductor so as to form part of the partition wall together with the thermal conductor. Further, the cooling section may be connected to the thermal conductor under the atmospheric pressure side which is the outside of the vacuum chamber. Furthermore, the thermal conductor driving section may drive the thermal conductor to move back and forth respect to the vessel.

Consequently, since the thermal conductor is driven to move back and forth so as to be brought out of and into contact with the vessel by means of the bellows and the thermal conductor driving section, even if the vessel is positioned far away from the partition wall, the vessel can be cooled efficiently while the atmosphere in the vacuum chamber is maintained. In this instance, a heat pipe may be provided in the vessel, and the thermal conductor may be driven so as to be brought into contact with a condensing portion or heat radiating portion of the heat pipe.

In the vacuum processing apparatus, the vacuum chamber may have a partition wall for defining the inside and the outside of the vacuum chamber. In this instance, the vessel may have a first receiving portion on which the thermal conductor can be placed thereon. Meanwhile, the cooling mechanism may include a second receiving portion provided on the partition wall in the vacuum chamber and capable of receiving the thermal conductor. Further, the cooling section may cool the thermal conductor placed on the second receiving section by thermal conduction through the partition wall. The thermal conductor driving section may transport the thermal conductor between the first receiving portion and the second receiving portion.

In the vacuum processing apparatus configured in such a manner as described above, if the thermal conductor cooled by the first receiving portion is transported to and placed on the second receiving portion, then even if the vessel is positioned far away from the partition wall, it can be cooled efficiently while the atmosphere in the vacuum chamber is maintained. In this instance, where the heat pipe is provided on the vessel, the thermal conductor driving section may transport and place the thermal conductor to and on the condensing portion or heat radiating portion of the heat pipe as the first receiving portion. In this instance, the cooling section may cool the thermal conductor by thermal conduction through the partition wall and the second receiving portion. Further, similarly as in the case of the configuration described above, a different thermal conductor separate from the thermal conductor placed on the first receiving portion may be connected to the cooling section on the atmospheric pressure side such that the thermal conductor is cooled through contact of the different thermal conductor with the thermal conductor placed on the first receiving portion through back and forth driving movement of the thermal conductor. Further, the thermal conductor may be placed one by one on the first receiving portion and the second receiving portion such that the thermal conductor driving section exchanges the thermal conductor placed on the first receiving portion and warmed by the heat of the vessel for the other thermal conductor placed on and cooled by the second receiving portion.

The vacuum processing apparatus may further include a movable body integrally movable with the vessel in the vacuum chamber. In this instance, the heat generating source may be a driving source for driving the movable body. Further, the cooling mechanism may be provided at a position corresponding to a predetermined home position of the movable body. Here, the movable body is, for example, a transport robot which transports a processing object such as a semiconductor wafer substrate or a glass substrate in the vacuum chamber through driving of a linear motor. However, the movable body is not limited to this.

Since the period of time within which the moving body stands by at the home position is comparatively long, where the cooling mechanism is provided at the position corresponding to the home position using the configuration described above, the vessel can be cooled efficiently. Further, where the thermal conductor driving section is configured such that it transports the thermal conductor between the first receiving portion and the second receiving portion, the period of time after the thermal conductor placed on the first receiving portion is moved away from the home position until it moves back to the home position can be utilized effectively to cool the vessel.

In the vacuum processing apparatus, the vessel may be composed of a first vessel and a second vessel. In this instance, the vacuum processing apparatus may further include a first moving body integrally movable with the first vessel and a second moving body integrally movable with the second vessel. Meanwhile, the heat generating source may include a first driving source and a second driving source for driving the first and second moving bodies, respectively. Further, the cooling mechanism may include a first cooling mechanism and a second cooling mechanism. The first cooling mechanism cools the first vessel while the second moving body operates. The second cooling mechanism cools the second vessel while the first moving body operates.

In the vacuum processing apparatus having the configuration described, since the plural vessels and moving bodies are provided and also the plural cooling mechanism are provided in a corresponding relationship, during operation of one of the moving bodies, the other moving body and vessel can be cooled efficiently without stopping processing of the vacuum processing apparatus. Where the first and second moving bodies move on the same linear line, the first and second cooling mechanisms may be provided at the opposite ends of the range of movement of the first and second moving bodies in the direction of the movement.

In the vacuum processing apparatus, the vacuum chamber may have a partition wall for defining the inside and the outside of the vacuum chamber. In this instance, the vacuum processing apparatus may further include a movable body and a guide section. The moving body is integrally movable with the vessel in the vacuum chamber. The guide section is provided on the partition wall along the direction of movement of the moving body in the vacuum vessel and guides the moving body upon movement of the same. Further, in this instance, the heat generating source may be a driving source for driving the moving body. Further, the cooling mechanism may have a cooling section provided outside the vacuum chamber for cooling the vessel through the guide section and the moving body.

By the configuration just described, since the guide section necessary for guiding the moving body is utilized for thermal conduction, the vessel can normally be cooled also during movement of the vessel. While the cooling section is an air cooling apparatus such as a fan, a water cooling apparatus, a heat pipe, a heat sink, a cryopump or the like, it is not limited to any of them. The moving body can be moved, for example, by a linear motor, and the guide section may be a linear guide for guiding the moving body upon movement of the same by the linear motor.

In the vacuum processing apparatus, the vacuum chamber may have a partition wall for defining the inside and the outside of the vacuum chamber. In this instance, the cooling mechanism includes an introduction mechanism and a discharging mechanism. The introduction mechanism introduces gas having a second temperature lower than a first temperature which the vessel has from the outside of the partition wall into the inside of the partition wall. The discharging mechanism discharges the gas introduced in the inside of the partition wall from the inside of the partition wall to the outside of the partition wall. In this instance, the vessel may have a shape in which it cooperates with the partition wall to form a flow channel for the gas introduced in the inside of the partition wall.

With the vacuum processing apparatus, since gas introduced into the inside of the partition wall by the introduction mechanism contacts with the partition wall and the vessel, the vessel can be cooled by thermal conduction. Although the gas is inert gas such as, for example, low-temperature nitrogen gas, helium gas or argon gas, it is not limited to any of them, but any gas may be used only if it has a temperature lower than that of the vessel.

A vacuum processing apparatus according to a further embodiment of the present invention includes a heat generating source, a vacuum chamber, a vessel, and an exchanging mechanism. The vacuum chamber is capable of maintaining a first pressure lower than the atmospheric pressure. The vessel is disposed in the vacuum chamber for accommodating the heat generating source airtightly at a second pressure higher than the first pressure. The exchanging mechanism is capable of exchanging first gas in the vessel heated to a first temperature by heat from the heat generating source for second gas of a second temperature lower than the first temperature.

Since the exchanging mechanism is provided, even where the vessel is provided in the vacuum chamber, the inside of the vessel can be cooled. Consequently, the problems arising from heat of the heat generating source in the vessel are solved.

The first gas and the second gas may be the same as each other or different from each other.

The vacuum chamber may have a partition wall for defining the inside and the outside thereof. In this instance, the exchanging mechanism may include a communication pipe which connects the vessel and the partition wall to each other so that the inside of the vessel and the outside of the vacuum chamber are communicated with each other to allow circulation of the first gas and the second gas.

The vessel may be movably provided in the vacuum chamber. In this instance, the communication pipe may have a removably-mounting mechanism for removably mounting the communication pipe on the vessel. With the configuration just described, where the vessel is movable within the vacuum chamber, for example, when the vessel substantially stops, the communication pipe is mounted on the vessel, and the first gas is exchanged for the second gas.

Alternatively, where the vessel is movably provided in the vacuum chamber, the communication pipe may have a removably-mounting mechanism for removably mounting the communication pipe on the partition wall.

The communication pipe may includes a discharge pipe for discharging the first gas in the vessel to the outside of the partition wall, and an introduction pipe for introducing the second gas from the outside of the partition wall into the vessel. Since the discharge pipe and the introduction pipe are provided separately from each other, the first gas and the second gas can be exchanged for each other efficiently.

The vacuum processing apparatus may further include a moving body capable of moving integrally with the vessel. In this instance, the communicating type may be mounted on and removed from the vessel at a home position of the moving body. Since the period of time within which the moving body stands by at the home position is comparatively long, where at least one primary side mechanism is disposed at a position corresponding to the home position, electric power is supplied efficiently to the driving source.

Where the moving body has a transport robot, the communication pipe is provided not only at the position corresponding to the home position but may be disposed, for example, at a position corresponding to a transfer position of the processing object between the vacuum processing apparatus and a different processing apparatus connected to the vacuum processing apparatus.

The communication pipe may be mounted on or removed from the partition wall at the home position of the moving body.

A plurality of communication pipes may be provided, and at least one of the communication pipes may be mounted on and removed from the vessel at the home position.

With the vacuum processing apparatus according to the present invention, the problem of gas from a cable or a like member is eliminated. Further, electric power can be supplied to the driving source in the vacuum chamber without adopting a complicated structure such as a cable duct.

The above and other objects, features and advantages of the present invention will become apparent from the following description and the appended claims, taken in conjunction with the accompanying drawings in which like parts or elements denoted by like reference symbols.

BRIEF DESCRIPTION OF THE DRAWINGS

FIG. 5 is a sectional view of a power supplying mechanism and a controller box of the vacuum transport apparatus shown in FIG. 1 as viewed in the direction of a Y axis;

DETAILED DESCRIPTION OF THE PREFERRED EMBODIMENTS

In the following, preferred embodiments of the present invention are described with reference to the accompanying drawings.

Figure 1:
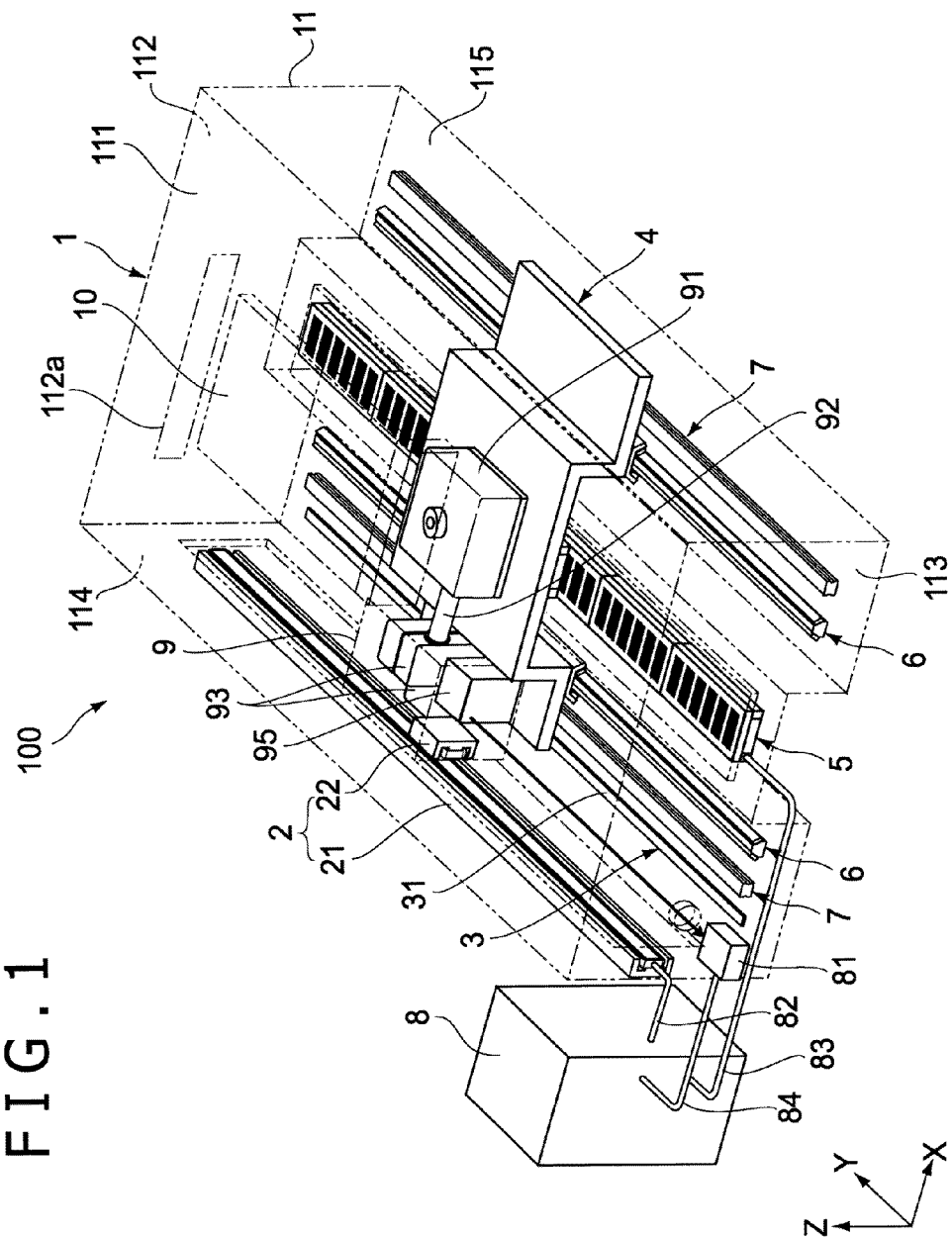
FIG. 1 is a perspective view showing a vacuum transport apparatus for transmitting a processing object in a vacuum chamber as a vacuum processing apparatus according to an embodiment of the present invention.
Figure 2:
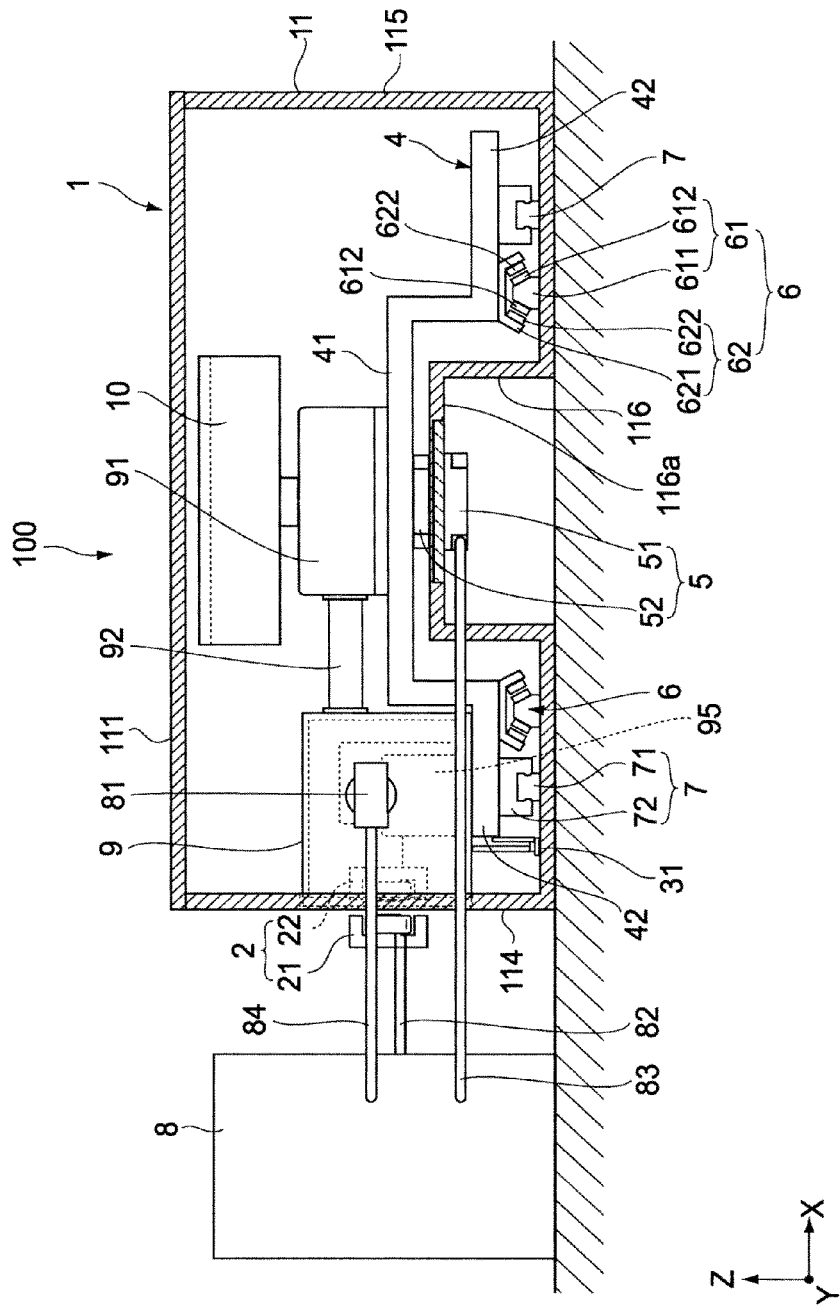
FIG. 2 is a sectional view of the vacuum transport apparatus shown in FIG. 1.
Figure 3:
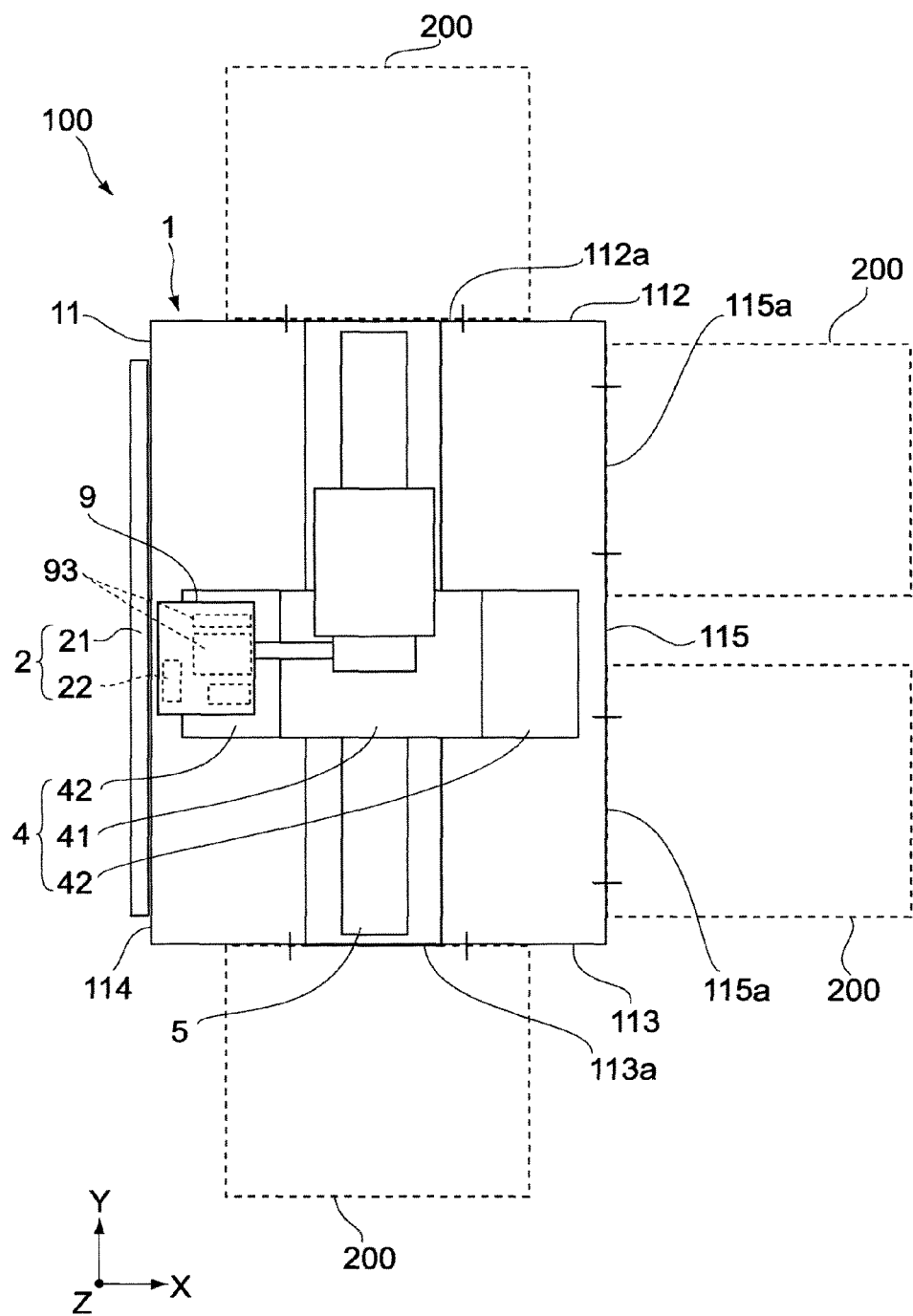
FIG. 3 is a schematic top plan view of the vacuum transport apparatus shown in FIG. 1.

FIG. 1 perspectively shows a vacuum transport apparatus for transporting a processing object in a vacuum chamber 1 as a vacuum processing apparatus according to an embodiment of the present invention. FIGS. 2 and 3 respectively show a cross section and a schematic top plan of the vacuum transport apparatus.

Referring to FIGS. 1 to 3, the vacuum transport apparatus 100 includes a vacuum chamber 1, a transport robot 10, a support table 4, a linear motor 5, a linear sensor 3, a power supply mechanism 2, a receiver 81 and a driver/power supply unit 8.

The transport robot 10 functions as a processing unit for processing a processing object not shown such as a semiconductor wafer or a glass substrate for use with a liquid crystal display unit disposed in the vacuum chamber 1. The support table 4 supports the transport robot 10 from the lower side. The linear motor 5 moves the support table 4 in the vacuum chamber 1. The linear sensor 3 is used for driving control of the linear motor 5. The power supply mechanism 2 supplies power to a driving source for the transport robot 10. The receiver 81 receives a detection signal detected by the linear sensor 3. The driver/power supply unit 8 is provided outside the vacuum chamber 1 and controls driving of the linear motor 5 based on a signal received by the receiver 81. Further, the driver/power supply unit 8 includes such as a power supply connected to the power supply mechanism 2.

The vacuum chamber 1 has a partition wall 11 for defining the inside and the outside of the vacuum chamber 1. The vacuum chamber 1 is connected to a vacuum pump not shown such that it can maintain a decompressed state in the partition wall 11. The degree of vacuum in the partition wall 11 is set so as to be substantially equal to the degree of vacuum of any other processing apparatus 200 connected to the vacuum transport apparatus 100. The partition wall 11 has a substantially rectangular parallelepiped shape and has an upper face 111, a front face 112 and a rear face 113 opposing to each other in the direction of movement of the transport robot 10, that is, in a Y-axis direction, a pair of side faces 114 and 115 opposing to each other in a direction perpendicular to the direction of movement, that is, in an X axis direction, and a bottom section 116 having a projection 116a extending toward the inner side of the partition wall 11. The linear motor 5 is laid on the projection 116a of the bottom section 116 of the partition wall 11 in a longitudinal direction of the projection 116a such that the transport robot 10 can move in the Y-axis direction along the longitudinal direction of the linear motor 5.

As seen in FIG. 3, the vacuum transport apparatus 100 typically is connected to and used together with several processing apparatus 200 such as a vapor deposition apparatus, a plasma etching apparatus and a load lock chamber which are used in a semiconductor fabrication process.

As an example, it is assumed that processing apparatus 200 are connected to the front face 112, side face 115 and rear face 113 of the partition wall 11 as seen in FIG. 3. In this instance, the transport robot 10 carries a processing object into or out of each of the processing apparatus 200 through an opening 112a, 115a or 113a. Only one such processing apparatus 200 may possibly be connected to the vacuum transport apparatus 100. It is to be noted that the opening 115a and so forth are opened or closed by a gate valve not shown.

The support table 4 has a shape corresponding to the shape of the bottom section 116 of the partition wall 11 and has an upper stage portion 41 and a pair of lower stage portions 42.

A driving box 91 is placed on the upper stage portion 41 of the support table 4 and has a driving section for the transport robot 10 accommodated therein. The driving box 91 is connected to a controller box 9 placed on the surface of one of the lower stage portions 42 through a cable duct 92. The insides of the driving box 91, cable duct 92 and controller box 9 are airtightly communicated with each other. The pressure in the vessels such as the driving box 91, cable duct 92 and controller box 9 is maintained substantially equal to the atmospheric pressure.

The driving section accommodated in the driving box 91 is formed from a motor not shown and other mechanisms for driving the transport robot 10. For the transport robot 10, a transport robot is used which has an articulated arm capable of making expanding and contracting operation and a holding section, that is, a hand, which is provided at an end portion of the arm for holding a processing object. However, the transport robot 10 is not limited to a transport robot of the type just described but may be a transport robot of a different type which has a holding section for folding a processing object although it does not have an articulated arm. The driving section in the driving box 91 can drive the arm of the transport robot 10 to carry out expanding or contracting operation or drives the transport robot 10 to carry out swinging operation to access a different one of the processing apparatus 200 connected to the vacuum chamber 1.

A pair of linear guides 7 are individually provided symmetrically in the X-axis direction on the rear face side of the lower stage portions 42 of the support table 4. Each of the linear guides 7 has a guide rail 71 laid on the bottom section 116 of the partition wall 11 along the Y-axis direction and a guided member 72 attached to the rear face of an associated one of the lower stage portions 42 of the support table 4 and engaging with the guide rail 71 to make sliding movement on the guide rail 71.

Referring to FIG. 2, a pair of magnetic bearing units 6 are individually provided symmetrically in the X-axis direction on the rear face side of the lower stage portions 42. Each of the magnetic bearing units 6 is formed from a bearing portion 61 laid on the bottom section 116 of the partition wall 11 along the Y-axis direction and a linear movable portion 62 attached to the rear face of an associated one of the lower stage portions 42 in such a manner as to leave a gap from the bearing portion 61. A pair of permanent magnets 612 are attached to a base portion 611 of the bearing portion 61 while a pair of permanent magnets 622 are attached to an attaching member 621 of the linear movable portion 62. The directions of the magnetic poles of the permanent magnets 612 and 622 are set such that the permanent magnets 612 and 622 repel each other. The magnetic bearing units 6 having the configuration just described can reduce the load to be applied to the linear guides 7 thereby to assure a long life of the linear guides 7.

Figure 4:
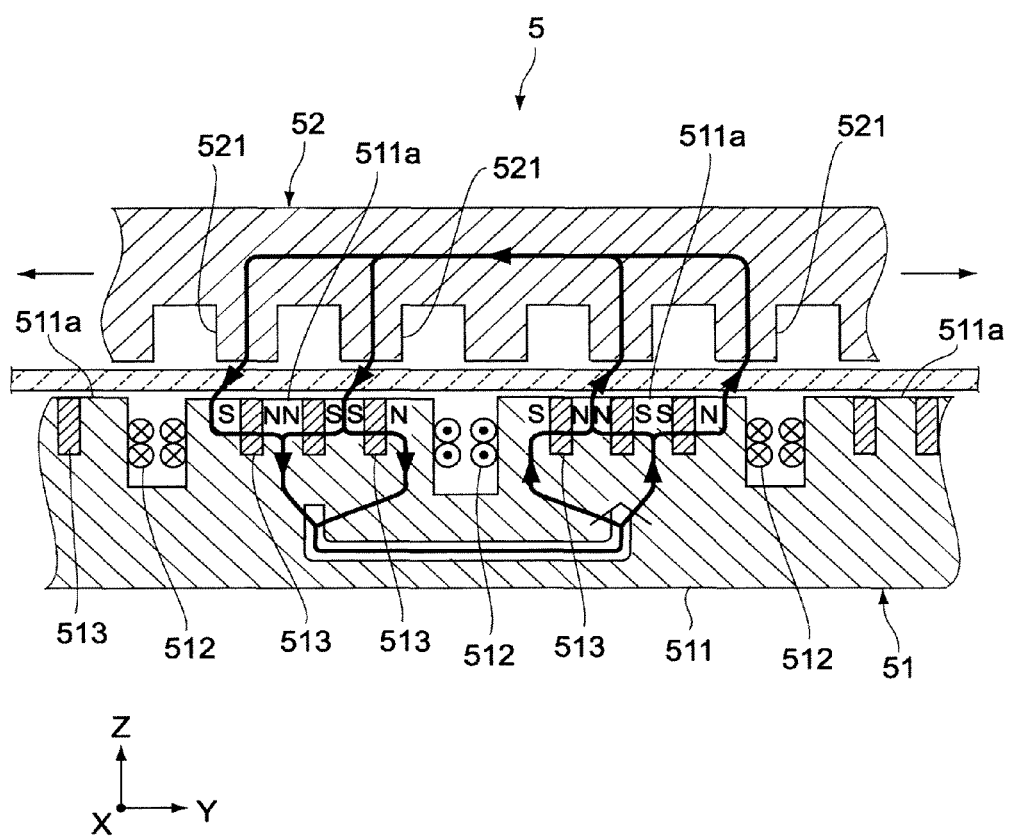
FIG. 4 is a sectional view of a linear motor of the vacuum transport apparatus shown in FIG. 1 as viewed in the direction of an X axis.

FIG. 4 shows a cross section of the linear motor 5 as viewed in the X-axis direction.

The linear motor 5 includes a stator 51 disposed on the rear face side of the projection 116a of the bottom section 116, that is, on the outer side of the partition wall 11, and a movable element 52 attached to the rear face of the upper stage portion 41 of the support table 4. The stator 51 includes a yoke 511 having a plurality of magnetic pole portions 511a disposed at equal distances in its longitudinal direction, that is, in the Y-axis direction, and a coil 512 wound on each of the magnetic pole portions 511a. A plurality of permanent magnets 513 are provided for each one of the magnetic pole portions 511a of the yoke 511. Each of the permanent magnets 513 is embedded in an associated magnetic pole portion 511a such that an end face thereof which opposes to the movable element 52 is exposed and is positioned in flush with the surface of the magnetic pole portion 511a.

The movable element 52 is a magnetic member having a plurality of teeth 521 in its longitudinal direction, that is, in the Y-axis direction.

In the linear motor 5 having such a configuration as described above, since a plurality of permanent magnets 513 are provided on one magnetic pole portion 511a of the stator 51, strong magnetic fluxes are generated in a gap between the stator 51 and the movable element 52. Consequently, higher thrust force can be obtained in comparison with linear motors of the other types.

The linear motor 5 may not be a linear motor of the type as in the present embodiment but may be a liner motor of any other type such as a PM type linear motor or a coreless type linear motor.

Referring to FIGS. 1 and 2, the driver/power supply unit 8 is connected to the receiver 81 and the coils 512 of the stator 51 of the linear motor 5 by electric cables 82 and 83, respectively. Since the electric cables 82 and 83 are placed under the atmospheric pressure outside the vacuum chamber 1, even where a wire connection is used in this manner, the problem of generation of gas does not occur.

The linear sensor 3 has a linear scale 31 laid on the bottom section 116 of the partition wall 11. From the linear scale 31, scale information is detected, for example, by a sensor head not shown attached to the associated lower stage portion 42 of the support table 4. The sensor head is connected to a transmitter 95 in the controller box 9, for example, through an electric cable in a cable duct not shown. The transmitter 95 transmits scale information detected by the sensor head to the receiver 81 by wireless communication, and the receiver 81 transits the scale information to the driver/power supply unit 8. The driver/power supply unit 8 controls driving of the linear motor 5 based on the information.

While the radio communication of the scale information from the transmitter 95 to the receiver 81 is carried out typically using a laser beam, it may be carried out otherwise using radio waves.

As the detection system of the linear sensor 3, an optical system, an electrostatic system, a magnetic system or some other system can be used.

Referring to FIGS. 1 and 2, the power supply mechanism 2 is disposed on the side face 114 of the partition wall 11. The power supply mechanism 2 is of the contactless type and includes a primary side mechanism, that is, a primary side electromagnet 21, disposed on the outer side of the partition wall 11, and a secondary side mechanism, that is, a secondary side electromagnet 22, disposed in the partition wall 11. The secondary side electromagnet 22 is disposed in the controller box 9 and connected to a controller 93 (FIG. 5) for controlling the driving section for the transport robot 10, for example, through a rectification circuit for converting ac power into dc power. The controller 93 includes a circuit board on which control circuits and other circuits are mounted, and other elements.

Figure 6:
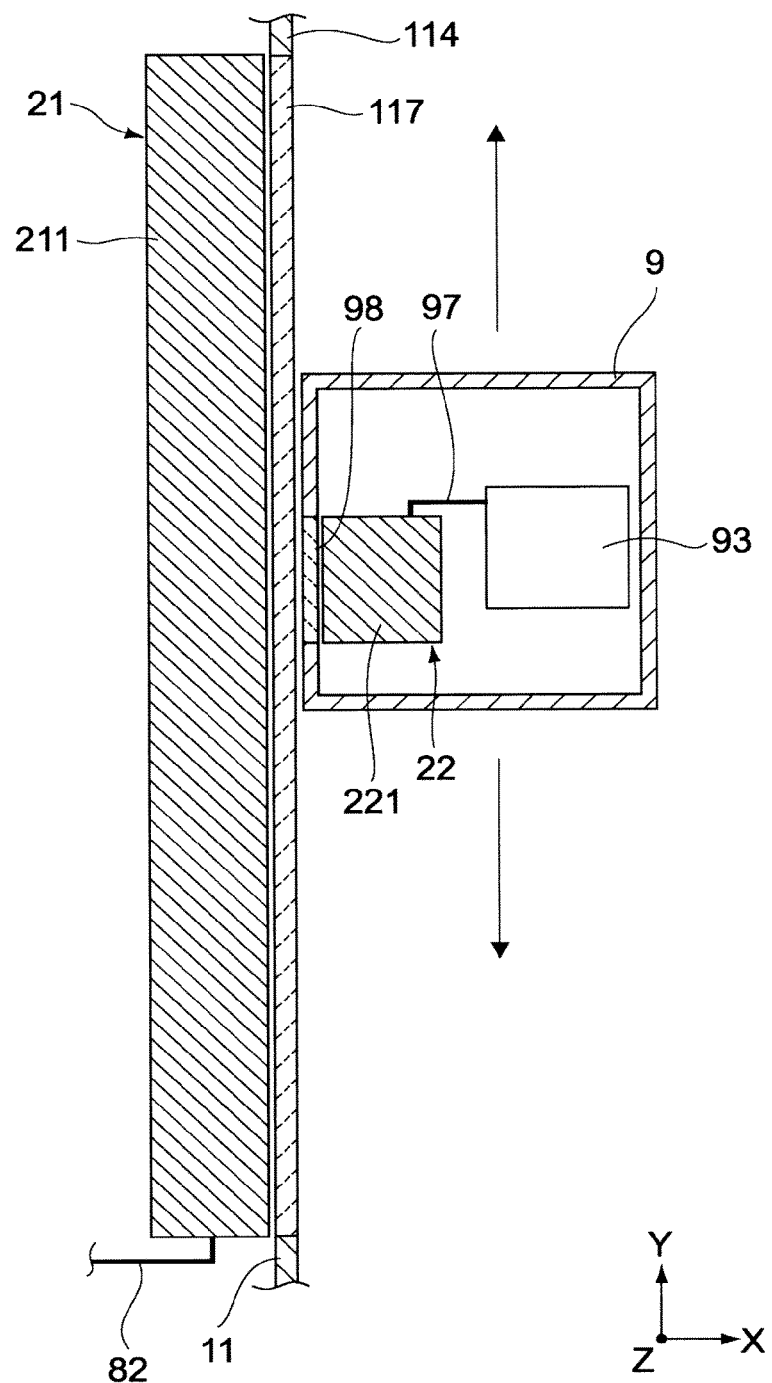
FIG. 6 is a sectional view of the power supplying mechanism and the controller box of the vacuum transport apparatus shown in FIG. 1 as viewed in the direction of a Z axis.

FIG. 5 shows a cross section of the power supply mechanism 2 and the controller box 9 as viewed in the Y-axis direction, and FIG. 6 shows a cross section of the power supply mechanism 2 and the controller box 9 in a Z-axis direction.

Referring to FIGS. 5 and 6, the power supply mechanism 2 uses an induced magnetic field from the primary side electromagnet 21 to supply power to the secondary side electromagnet 22. For example, the primary side electromagnet 21 and the secondary side electromagnet 22 include E-shaped cores 211 and 221 and coils 212 and 222 connected to the E-shaped cores 211 and 221, respectively.

The primary side electromagnet 21 extends along the transport direction of the transport robot 10 and is formed with a length corresponding to the range of movement of the transport robot 10 in the vacuum chamber 1. The secondary side electromagnet 22 is disposed in the controller box 9 as described above and is disposed such that it opposes to the primary side electromagnet 21 at least within a range within which the transport robot 10 moves.

A transmitting member 117 for transmitting a magnetic field therethrough is provided at a position of the partition wall 11 which opposes to the primary side electromagnet 21 and the secondary side electromagnet 22. Also on the controller box 9, a transmitting member 98 is provided at a position at which it opposes to the primary side electromagnet 21 and the secondary side electromagnet 22. The transmitting members 117 and 98 are formed, for example, using a dielectric material or a semiconductor. The dielectric may be, for example, glass or ceramics, and the semiconductor may be, for example, silicon. Where a semiconductor is used, eddy current can be suppressed more as the intrinsic properties thereof increase. Since such transmitting members 117 and 98 as described above are used, power can be supplied efficiently from the primary side electromagnet 21 to the secondary side electromagnet 22 while suppressing generation of eddy current.

The primary side electromagnet 21 is connected to a power supply apparatus not shown in the driver/power supply unit 8. The power supply apparatus includes a high frequency inverter circuit, a control circuit and so forth, and the high frequency inverter circuit converts dc power of the power supply into ac power. The frequency of the ac power typically is 10 kHz, but is not limited to this, and a suitable frequency may be selected, for example, based on the material of the transmitting member. The control circuit mentioned controls the high frequency inverter circuit to superpose a communication signal to the controller 93 and so forth serving as the driving source of the transport robot 10 on a high frequency magnetic field generated from the primary side electromagnet 21. The communication signal must include at least a start signal for starting operation of the controller 93.

The controller 93 in the controller box 9 rectifies high frequency power obtained from a magnetic field which the secondary side electromagnet 22 receives from the primary side electromagnet 21 and detects a communication signal from the high frequency power. The controller 93 thus uses the power to transmit the communication signal to the driving section for the transport robot 10 to drive the transport robot 10.

It is to be noted that the power which the secondary side electromagnet 22 receives from the primary side electromagnet 21 is supplied not only to the controller 93 and the transmitter 95 but also to driving sources for various sensors not shown in the vacuum chamber 1 and driving sources of other mechanism.

While, in FIGS. 5 and 6, the high-frequency power and the communication signals overlap on the coils 212 and 222 and the feed lines 82 and 97, the coil and the feed line for the high frequency power and the coil and the feed line for the communication signal may be provided separately.

Since, in the present embodiment, both of the primary side electromagnet 21 and the secondary side electromagnet 22 are placed under the atmospheric pressure, it is possible to prevent generation of gas from varnish for insulation for the coils 212 and 222 respectively included in the electromagnets 21 and 22, a resin mold and so forth.

In the present embodiment, the primary side electromagnet 21 is formed with a length corresponding to the range of movement of the transport robot 10 in the vacuum chamber 1 in the transport direction of the transport robot 10. Consequently, power can be supplied continuously and stably to the controller 93.

In the present embodiment, the controller 93, transmitter 95 and so forth are accommodated in the controller box 9 similarly to the secondary side electromagnet 22. Accordingly, circuit boards, circuit elements and so forth included in the controller 93 and the transmitter 95 are not exposed to the vacuum, and a bad influence on them can be prevented. Also the electric cable 97 for connecting the secondary side electromagnet 22 and the controller 93 to each other can be accommodated in the controller box 9, and generation of gas can be prevented.

Figure 7:
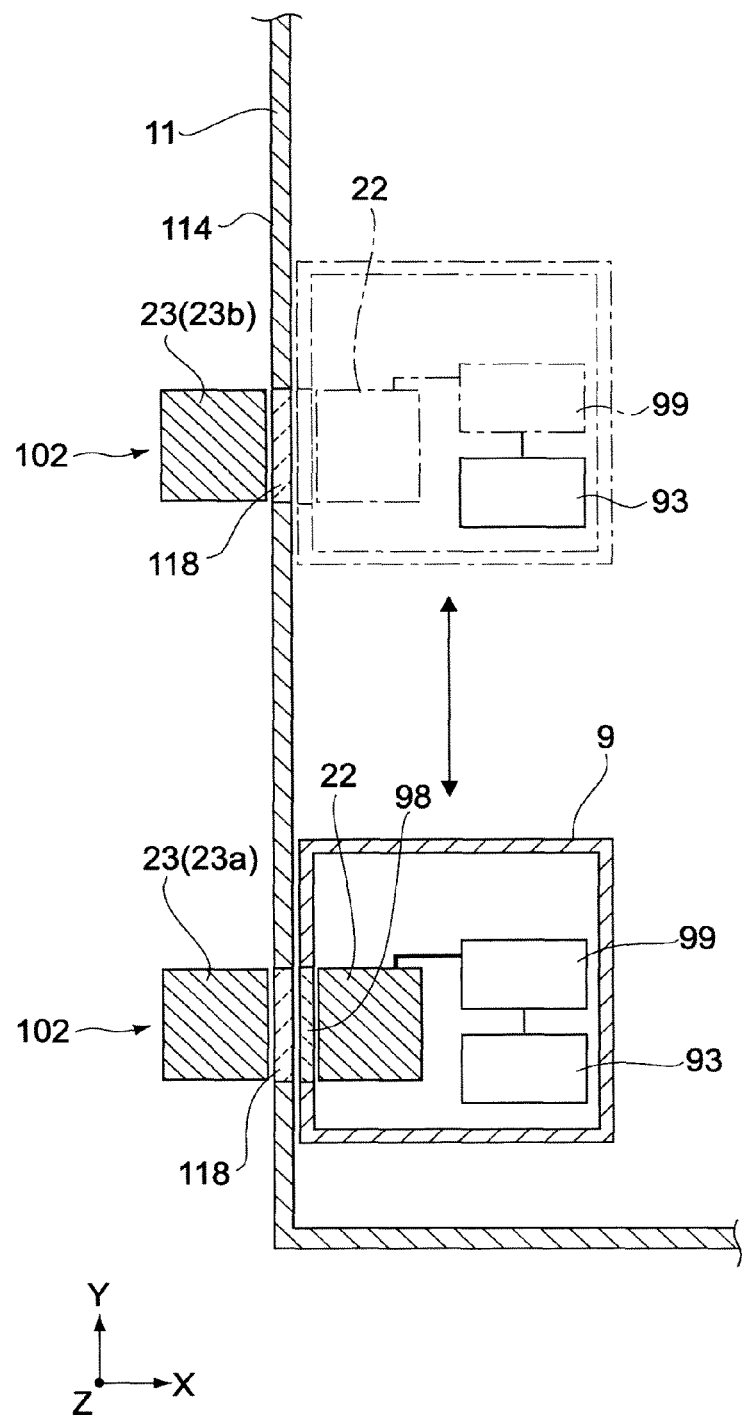
FIG. 7 is a schematic sectional view showing a power supplying mechanism according to another embodiment of the present invention.

FIG. 7 schematically shows a cross section of a power supplying mechanism 102 according to another embodiment of the present invention. In the description given below, members, functions and so forth similar to those of the vacuum transport apparatus 100 and the power supply mechanism 2 and so forth according to the embodiment described hereinabove with reference to FIGS. 1 to 6 are simply described or omitted, but the differences are described principally.

Referring to FIG. 7, in the power supply mechanism 102, a plurality of primary side electromagnets 23 are disposed intermittently along the transporting direction of the transport robot 10. The primary side electromagnets 23 have an E-shaped core and a coil similarly as in the primary side electromagnet 21 described hereinabove but are different in length thereof in the Y-axis direction. At least one of the primary side electromagnets 23, for example, the primary side electromagnet 23*a*, is disposed at a position corresponding to a home position of the transport robot 10. Naturally, a plurality of home positions may be set while a plurality of primary side electromagnets 23 are disposed individually corresponding to the home positions. A primary side electromagnet 23 may be disposed also at a position or positions other than the home position or positions, for example, at a position corresponding to a transfer position or positions of a processing object between the transport robot 10 and one or more external processing apparatus 200.

A transmitting member 118 is provided on the side face 114 of the partition wall 11 in a corresponding relationship to each of the positions of the primary side electromagnets 23.

In the present embodiment, a battery charger 99 for storing power received by the secondary side electromagnet 22 is provided in the controller box 9. Consequently, for example, at the home position, the battery charger 99 is charged by power supply from the power supply mechanism 102, and at any position at which a primary side electromagnet 23 and a secondary side electromagnet 22 do not oppose each other, the controller 93 can utilize power supplied from the battery charger 99 to drive the transport robot 10.

With the power supply mechanism 102 having such a configuration as described above, since the primary side electromagnets 23 and the transmitting members 118 are disposed intermittently, the cost required by the primary side electromagnets 23 and the transmitting members 118 can be reduced in comparison with the primary side electromagnet 21 shown in FIG. 6.

Since the period of time within which the transport robot 10 stands by at the home position is comparatively long, power is supplied efficiently to the controller 93 because at least one primary side electromagnet 23 is disposed at a position corresponding to the home position.

Figure 8:
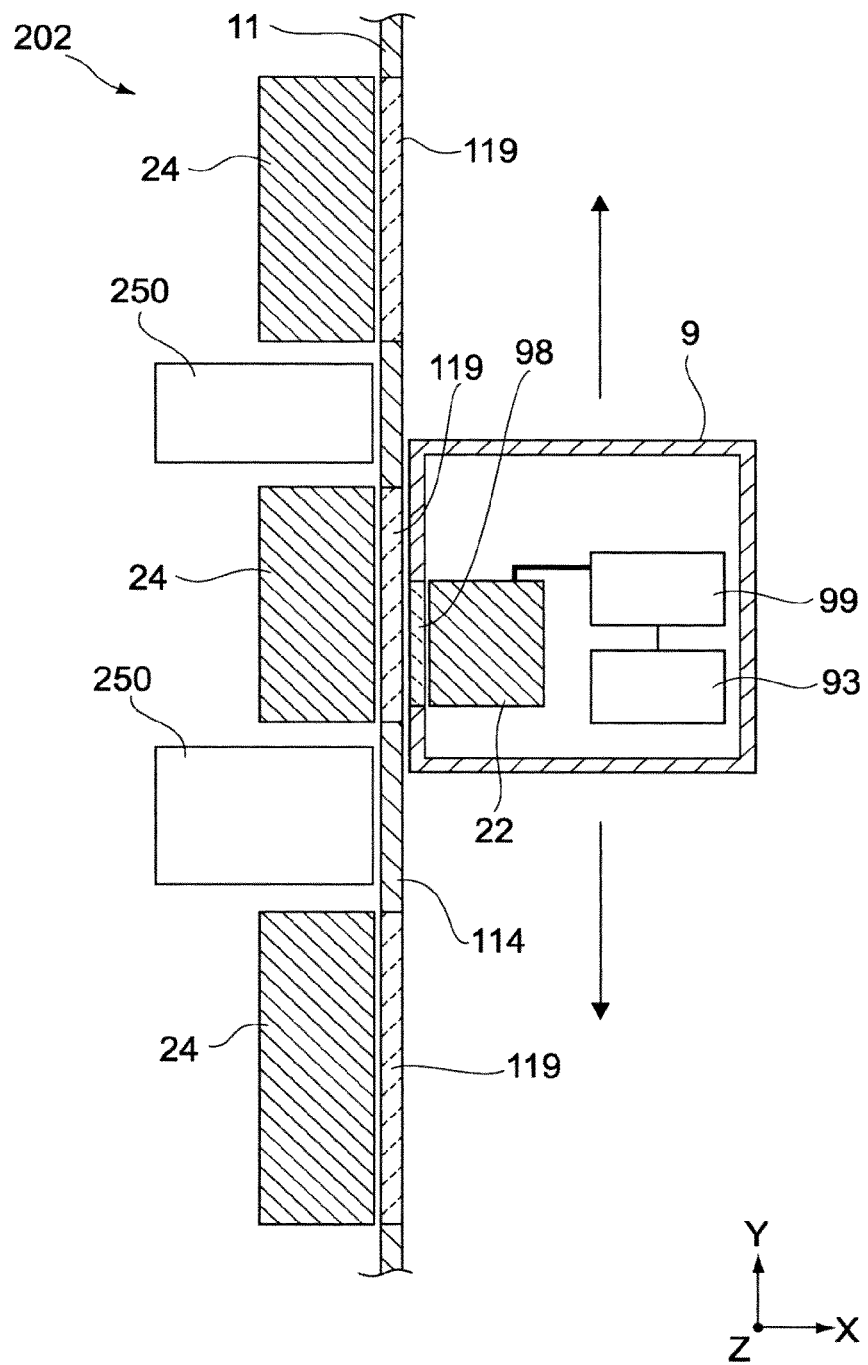
FIGS. 8, 9 and 10 are schematic sectional views showing power supplying mechanisms according to further embodiments of the present invention.

FIG. 8 schematically shows a cross section of a power supply mechanism 202 according to a further embodiment of the present invention.

Referring to FIG. 8, in the power supply mechanism 202, a plurality of primary side electromagnets 24 are disposed intermittently along the transporting direction of the transport robot 10 in such a manner as to bypass other structures such as apparatus and pipes disposed on the outer side of the partition wall 11. A transmitting member 119 is provided at each of positions of the side face 114 of the partition wall 11 which correspond to the primary side electromagnets 24.

The battery charger 99 connected to the secondary side electromagnet 22 may be provided in the controller box 9. It is to be noted that some of the positions in FIG. 8 at which the primary side electromagnets 24 are disposed bypassing the other apparatus or structures 250 may be determined as a home position described hereinabove in connection with the embodiment shown in FIG. 7.

Figure 9:
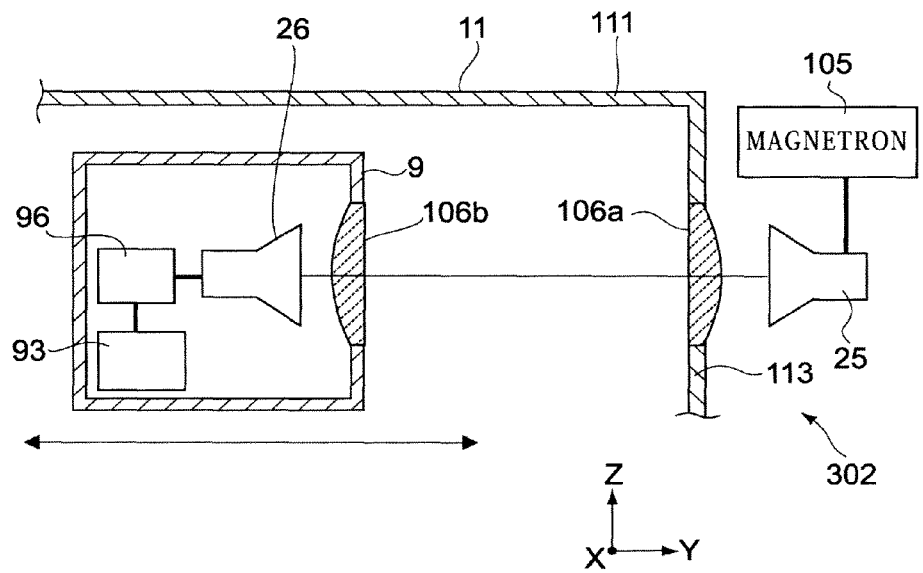

FIG. 9 schematically shows a cross section of a power supply mechanism 302 according to a still further embodiment of the present invention.

Referring to FIG. 9, the power supply mechanism 302 uses radio waves to supply energy of electric power to the controller 93 and so forth. While microwaves are used as such radio waves, radio waves of some other wavelength may be used.

The primary side mechanism of the power supply mechanism 302 is a transmission antenna 25 for microwaves, which is connected to a magnetron 105 serving as a power supply. The transmission antenna 25 is disposed, for example, in an opposing relationship to the rear face 113 of the partition wall 11. The secondary side mechanism is a reception antenna 26 for receiving microwaves sent from the transmission antenna 25. Electric power received by the reception antenna 26 is impedance-matched with and rectified by a matching-rectification element 96 and then supplied to the controller 93. A communication signal is transferred by modulation of microwaves.

At a position of the partition wall 11 between the transmission antenna 25 and the reception antenna 26 and at a position of the controller box 9 between the transmission antenna 25 and the reception antenna 26, a pair of condenser lenses 106*a* and 106*b* are used as transmitting members for transmitting microwaves therethrough. Consequently, microwaves are provided with directional characteristics, whereby the efficiency of transferring energy can be enhanced. Typical material of the condenser lenses 106*a* and 106*b* may be dielectric.

Further, the power supply mechanism 302 according to the present embodiment can transmit electric power even where the distance between the transmission antenna 25 and the reception antenna 26 is great. Consequently, as shown in FIG. 9, the transmission antenna 25 and the reception antenna 26 can be disposed, for example, along the Y-axis direction which is the transport direction of the transport robot 10, and therefore, the degree of freedom in disposition of them enhances.

In the embodiment shown in FIG. 9, a transmitting member which is made of dielectric and does not have a function of a lens may be used in place of each of the condenser lenses 106*a* and 106*b*.

Figure 10:
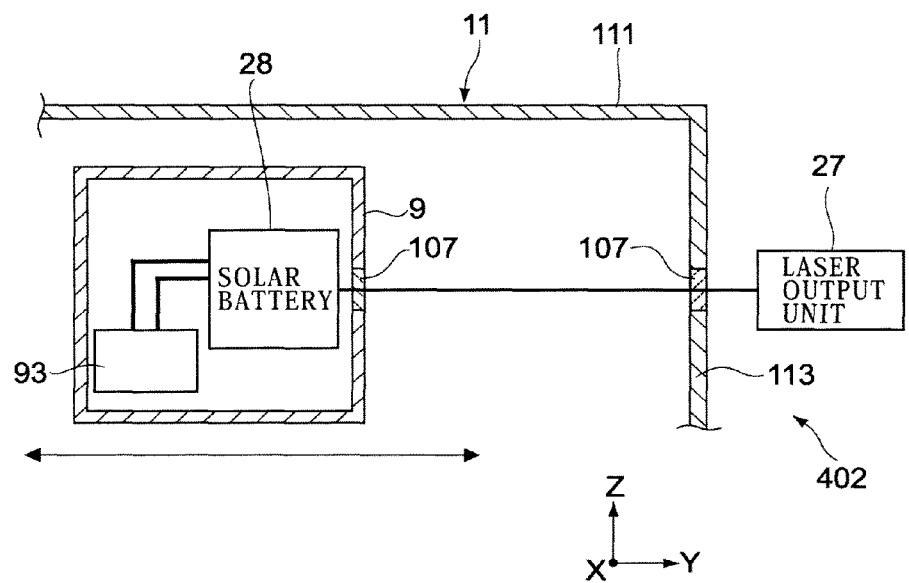

FIG. 10 schematically shows a cross section of a power supply mechanism 402 according to a yet further embodiment of the present invention.

Referring to FIG. 10, the primary side mechanism of the power supply mechanism 402 is a laser output unit 27 and the secondary side mechanism is a solar battery 28. The laser output unit 27 is disposed, for example, in an opposing relationship to the rear face 113 of the partition wall 11. The laser output unit 27 outputs, for example, a laser light of an ultraviolet ray, a visible ray or an infrared ray. At a position of the partition wall 11 between an output point of the laser output unit 27 and a light receiving point of the solar battery 28, a transmitting member 107 of glass or the like which transmits a laser beam therethrough is provided. Similarly, also on the controller box 9, another transmitting member 107 is used. A communication signal is transferred by optical modulation.

Also with such a configuration as described above, similar effects to those of the power supply mechanism 302 shown in FIG. 9 can be achieved.

Figure 11:
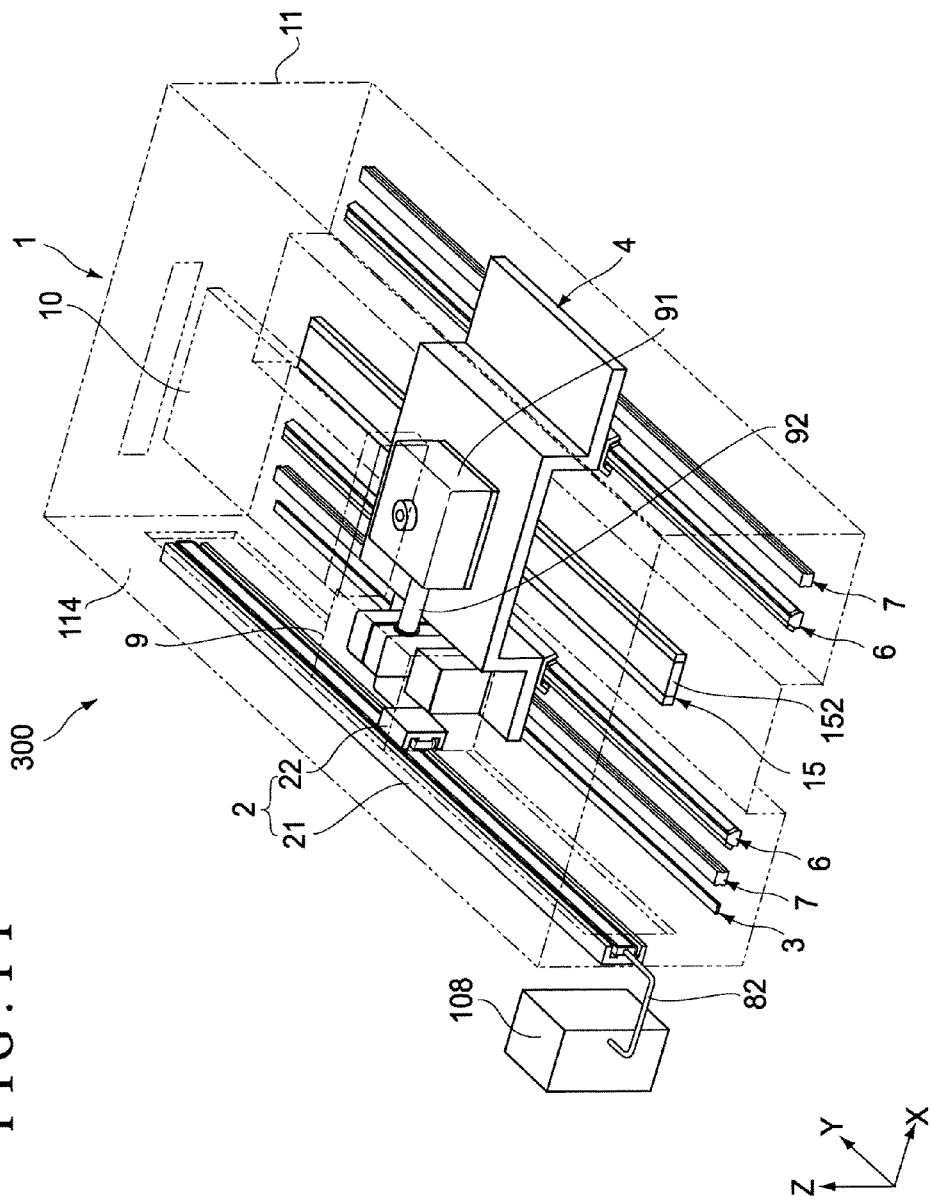
FIG. 11 is a perspective view showing a vacuum transport apparatus according to a yet further embodiment of the present invention.
Figure 12:
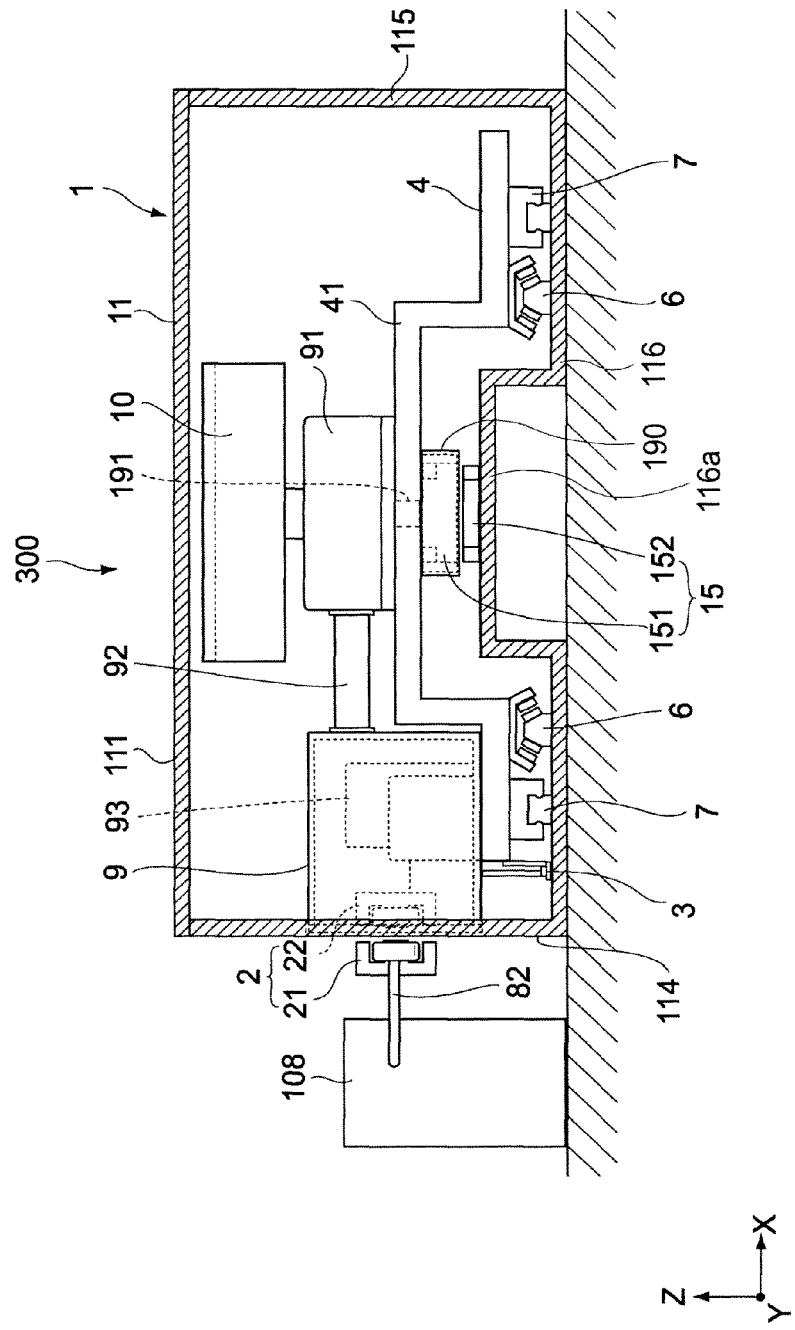
FIG. 12 is a sectional view of the vacuum transport apparatus shown in FIG. 11.

FIG. 11 perspectively shows a vacuum transport apparatus 300 according to a yet further embodiment of the present invention, and FIG. 12 shows a cross section of the vacuum transport apparatus 300.

Referring to FIGS. 11 and 12, in the vacuum transport apparatus 300, a power supply unit 108 is connected to the primary side electromagnet 21 of the power supply mechanism 2. While, in the vacuum transport apparatus 100 shown in FIGS. 1 and 2, the driver for driving the linear motor 5 is disposed in the driver/power supply unit 8 outside the vacuum chamber 1, in the vacuum transport apparatus 300 according to the present embodiment, the driver is disposed in the controller box 9.

A movable element box 190 housing a movable element 151 serving as the primary side of the linear motor 15 is disposed on the rear face side of the upper stage portion 41 of the support table 4. The movable element box 190 is attached to the rear face of the upper stage portion 41 and moves integrally with movable elements such as the transport robot 10 and the support table 4. A stator 152 which serves as the secondary side of the linear motor 15 extends in the Y-axis direction in an opposing relationship to the movable element box 190 on the projection 116a of the bottom section 116 of the partition wall 11. The linear motor 15 may be one which was described hereinabove with reference to FIG. 4. In this instance, the structure of the stator 152 and the movable element 151 is opposite to that of the stator 51 and the movable element 52 shown in FIG. 4.

The movable element box 190 is formed from a material through which a magnetic field can be transmitted between the movable element 151 and the stator 152. The movable element box 190 is connected to the driving box 91, for example, by a cable duct 191 (refer to FIG. 12) fitted in a through-hole formed in the upper stage portion 41 of the support table 4 such that the insides of the movable element box 190 and the driving box 91 are airtightly communicated with each other and are kept in a substantially atmospheric pressure state. The driver for the linear motor 15 described above which is disposed in the controller box 9 and includes control circuits and so forth is connected to the coil of the movable element 151 of the linear motor 15 by an electric cable extending through the cable duct 92, driving box 91 and cable duct 191.

In the present embodiment, the object of supply of electric power by the power supply mechanism 2 is at least the drivers for the controller 93 and the linear motor 15 for driving the transport robot.

By such a configuration of the vacuum transport apparatus 300 as described above, gas can be prevented from being generated from varnish or a resin mold included in the movable element 151.

Further, the driver for the linear motor 15 can transmit a driving signal based on scale information obtained from the linear sensor 3 to the movable element 151 by an electric cable wired in the controller box 9, driving box 91 and movable element box 190. Consequently, gas can be prevented from being generated.

Figure 13:
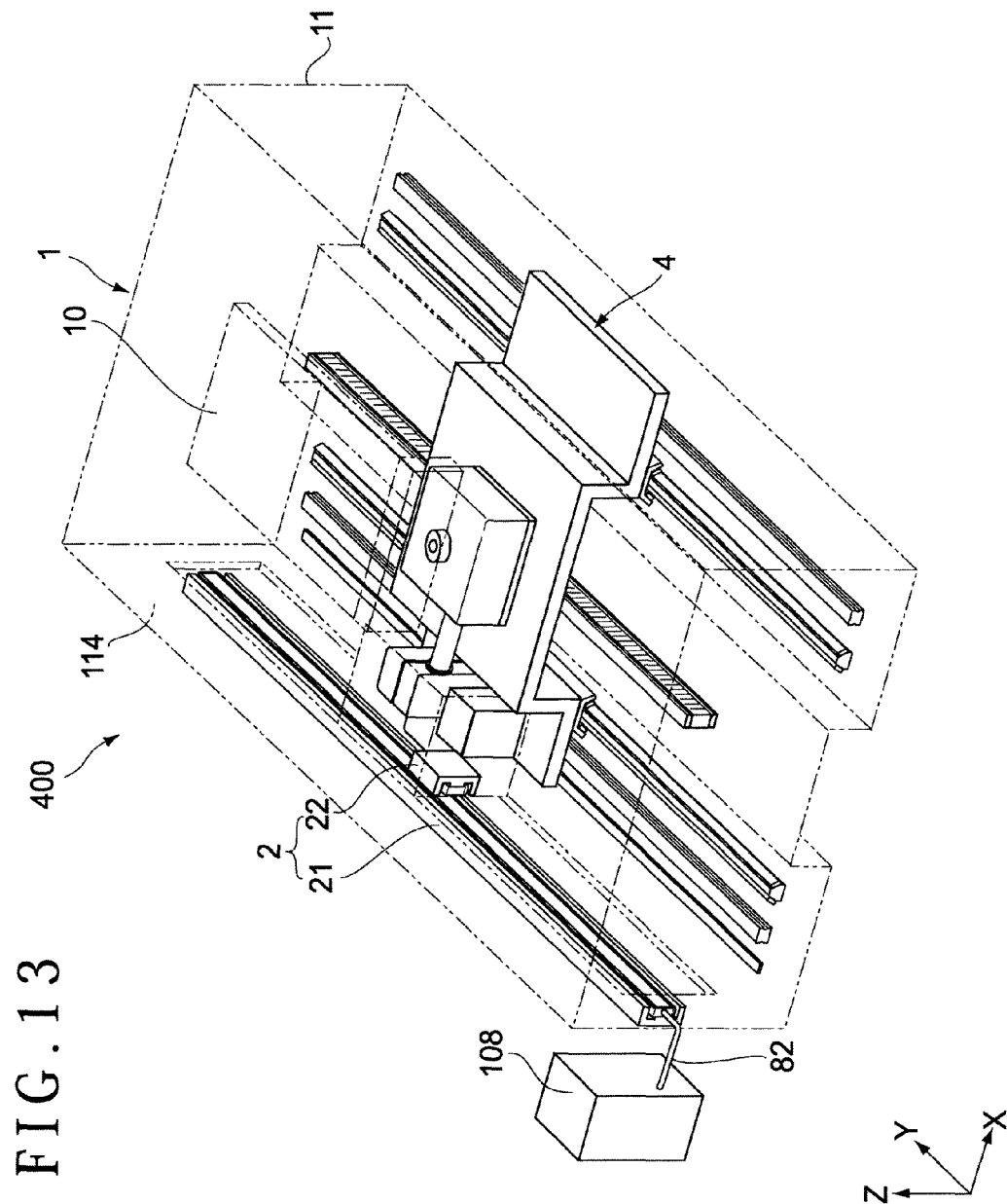
FIG. 13 is a perspective view showing a vacuum transport apparatus according to a yet further embodiment of the present invention.
Figure 14:
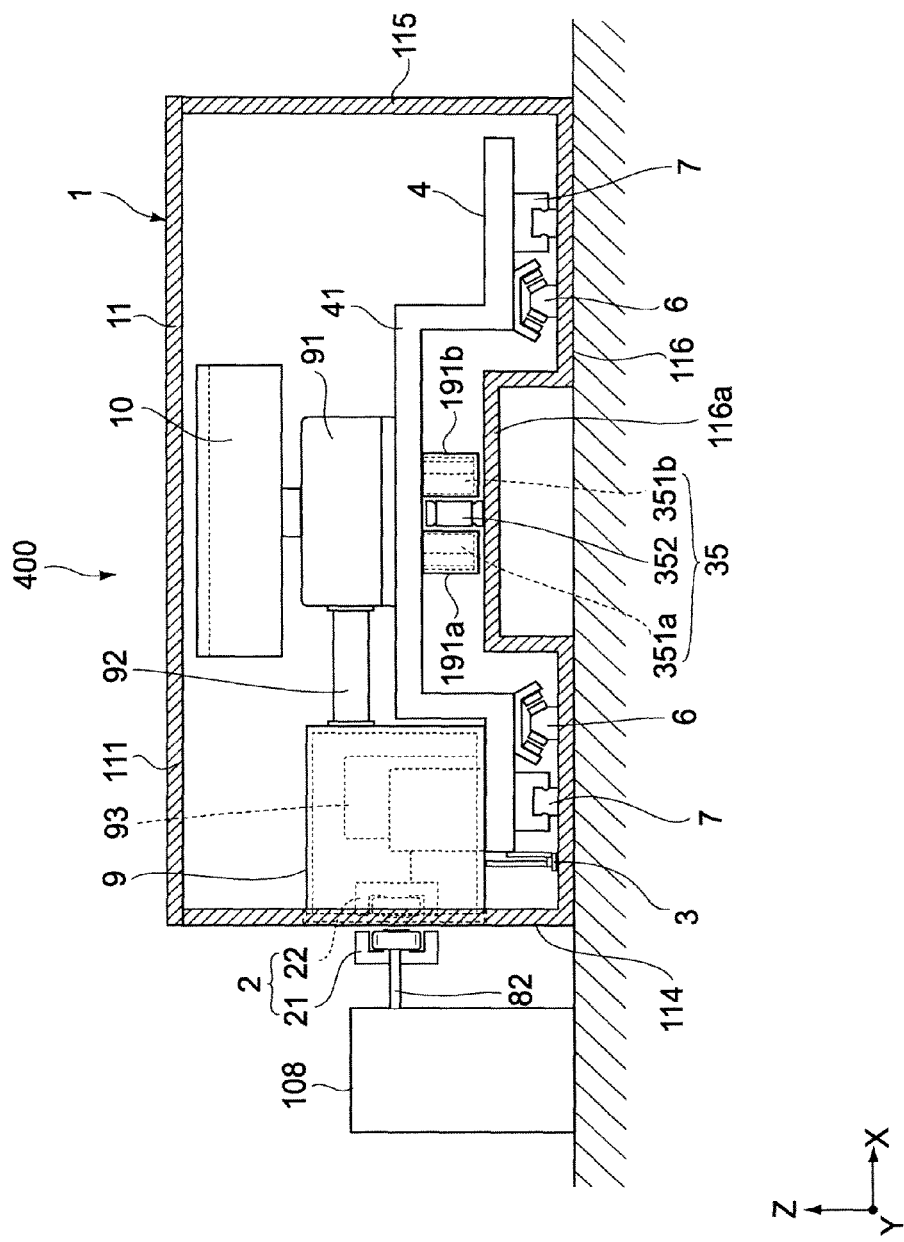
FIG. 14 is a sectional view of the vacuum transport apparatus shown in FIG. 13.

FIG. 13 perspectively shows a vacuum transport apparatus 400 according to a yet further embodiment of the present invention, and FIG. 14 shows a cross section of the vacuum transport apparatus 400.

Referring to FIGS. 13 and 14, the vacuum transport apparatus 400 includes a double-sided linear motor 35 wherein a pair of movable elements 351a and 351b are disposed on the opposite sides of and along a stator 352. The movable elements 351a and 351b on the primary side of the linear motor 35 are attached to the rear face of the upper stage portion 41 of the support table 4. The stator 352 which is the secondary side is disposed between the movable elements 351a and 352a and extends in the Y-axis direction. The stator 352 is provided on the projection 116a of the bottom section 116 of the partition wall 11 such that it is erected in the upward and downward direction, that is, in the Z-axis direction.

The movable elements 351a and 351b are accommodated, for example, in the airtight movable element boxes 191a and 191b, respectively. The inside of the movable element boxes 191a and 191b is airtightly communicated with the inside of the controller box 9 and the inside of the driving box 91 in a similar manner as in the embodiment described hereinabove with reference to FIG. 12.

The movable elements 351a and 351b are configured, for example, similarly to the stator 51 described hereinabove with reference to FIG. 4. The stator 352 is configured, for example, similarly to the movable element 52 described hereinabove with reference to FIG. 4 and has the magnetic pole portions directed in the opposite leftward and rightward directions, that is, substantially in a horizontal direction. The movable elements 351a and 352a are disposed in an opposing relationship to the magnetic pole portions of the stator 352 which are directed in the opposite leftward and rightward directions. Accordingly, at positions between the stator 352 and the movable elements 351a and 351b of the movable element boxes 191a and 191b, a transmitting member not shown which transmits a magnetic field therethrough is provided.

According to such a configuration as described above, when the linear motor 35 operates, the attracting force by magnetism acts substantially in a horizontal direction between a moving body including the support table 4, transport robot 10 and so forth and the stator 352. Accordingly, the weight load of the moving body applied to the linear guides 7 is reduced, and the life of the linear guides 7 can be extended.

Figure 15:
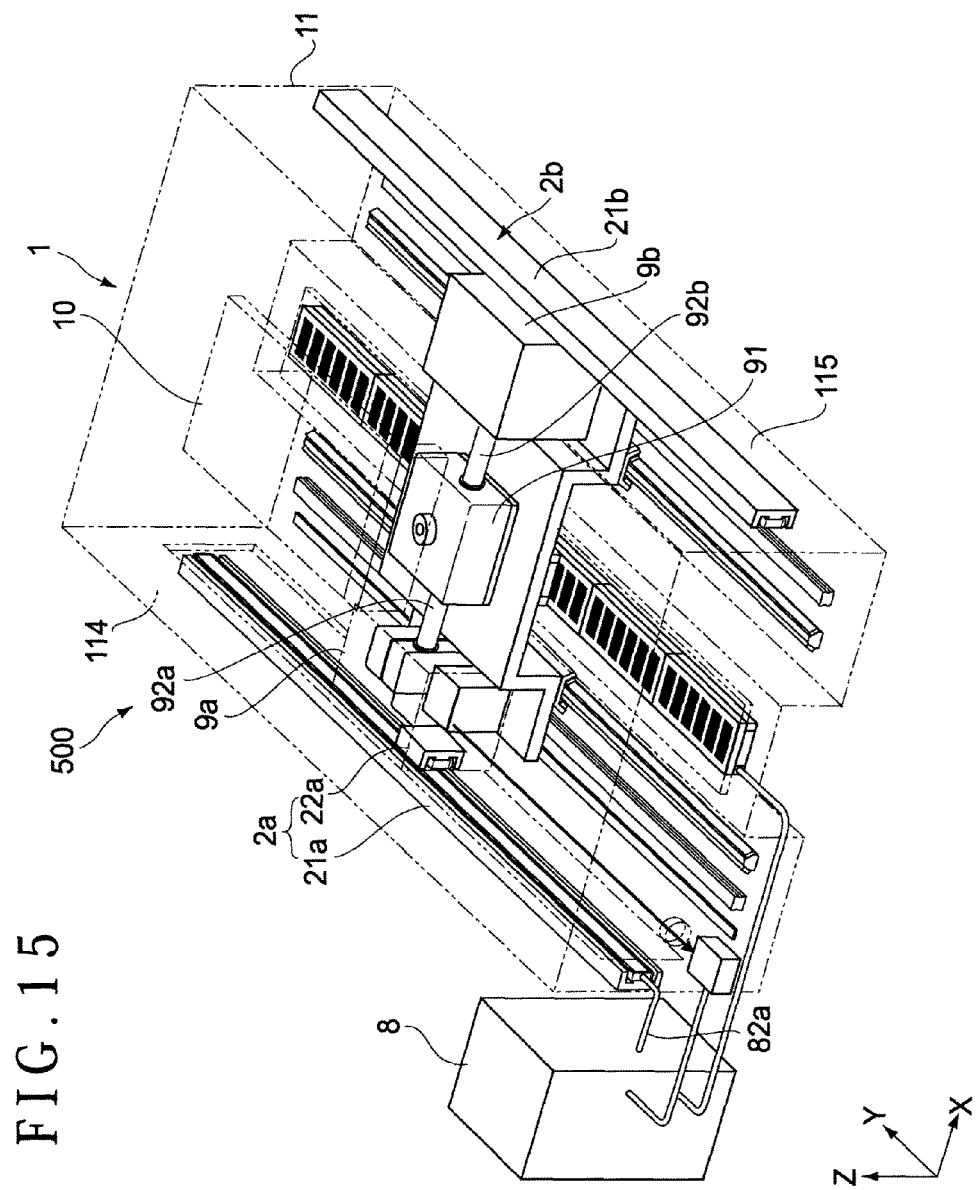
FIG. 15 is a perspective view showing a vacuum transport apparatus according to a yet further embodiment of the present invention.
Figure 16:
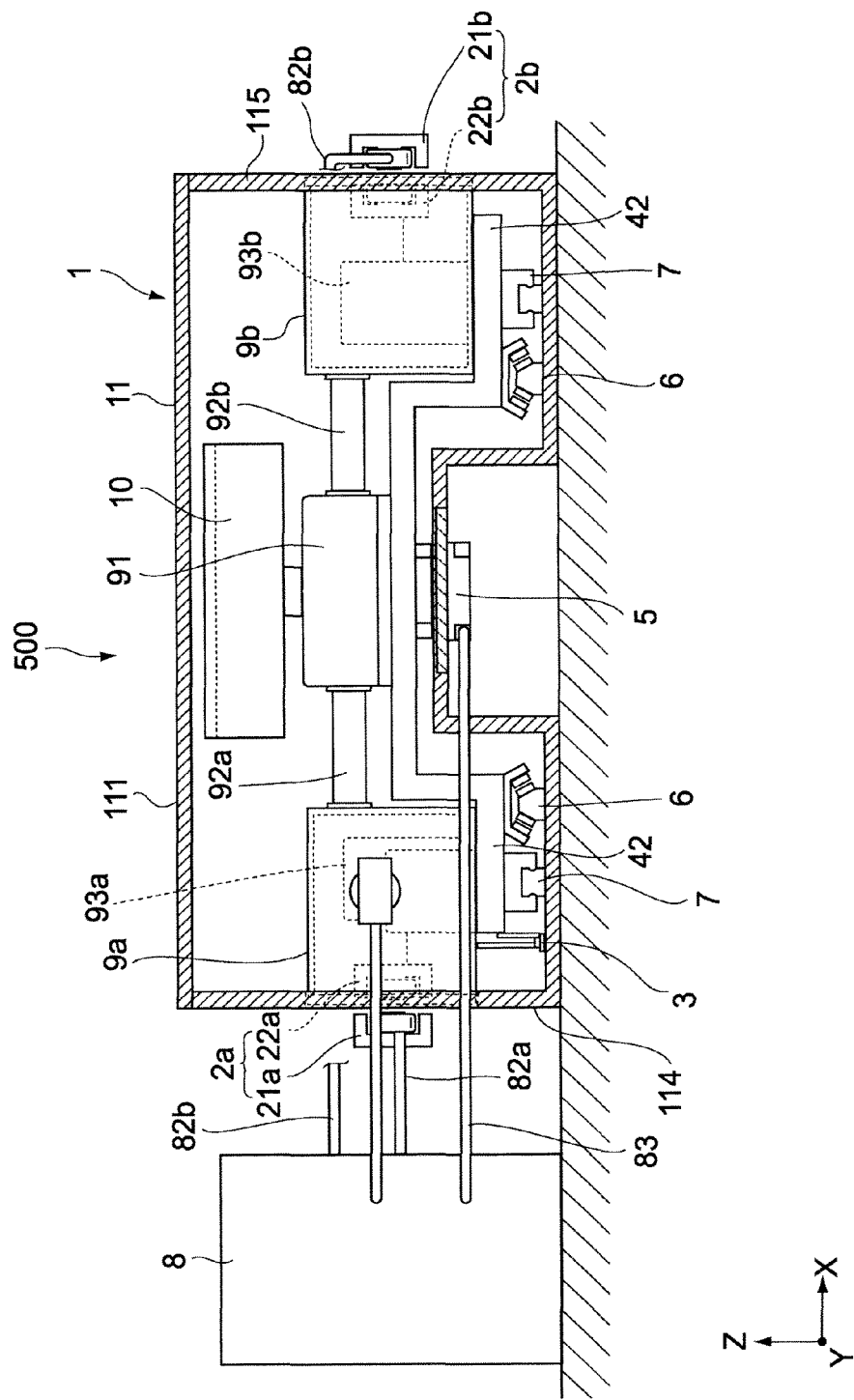
FIG. 16 is a sectional view of the vacuum transport apparatus shown in FIG. 15.

FIG. 15 perspectively shows a vacuum transport apparatus 500 according to a yet further embodiment of the present invention. FIG. 16 shows a cross section of the vacuum transport apparatus 500.

Referring to FIGS. 15 and 16, the vacuum transport apparatus 500 includes power supply mechanisms 2a and 2b provided on the opposite side faces 114 and 115 of the partition wall 11. The power supply mechanisms 2a and 2b have a structure substantially same as that of the power supply mechanism 2. In particular, the power supply mechanism 2a includes a primary side electromagnet 21a extending in the Y-axis direction and a secondary side electromagnet 22a built in a controller box 9a. The power supply mechanism 2b includes a primary side electromagnet 21b extending in the Y-axis direction and a secondary side electromagnet 22b built in a controller box 9b.

The vacuum transport apparatus 500 includes the driver/power supply unit 8 similarly to the vacuum transport apparatus 100 described hereinabove. The power supply apparatus built in the driver/power supply unit 8 is connected to the power supply mechanisms 2a and 2b by electric cables 82a and 82b, respectively (refer to FIG. 16).

In the controller box 9*a*, a controller 93*a* and so forth are disposed similarly as in the controller box 9. The controller box 9*b* is placed on the lower stage portions 42 of the support table 4 similarly to the controller box 9*a*. The inside of the controller box 9*b* is airtightly formed, and a controller 93*b* which serves as a driving source for the transport robot 10 or some other apparatus and sensors and is connected to the driving box 91 through a cable duct 92*b*.

In this manner, the controller boxes 9*a* and 9*b*, cable ducts 92*a* and 92*b* and so forth are disposed substantially symmetrically with respect to the Y axis extending in the principal transport direction of the transport robot 10. Accordingly, the center of gravity of a moving body including the support table 4, transport robot 10, controller boxes 9*a* and 9*b* and so forth coincides with the central position in the X-axis direction, and imbalance of the weight load to be applied to the linear guides 7 can be reduced.

Figure 17:
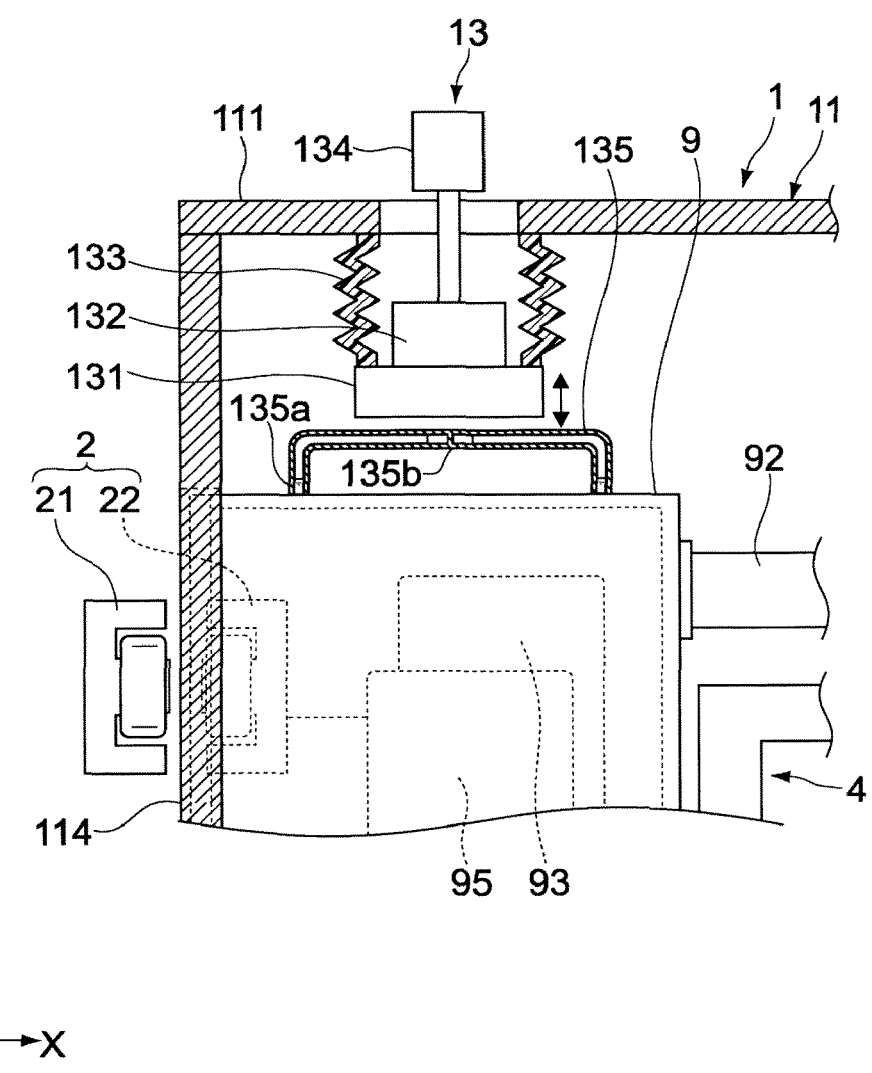
FIG. 17 is a sectional view showing part of a vacuum transport apparatus according to a yet further embodiment of the present invention.

FIG. 17 shows a cross section of part of a vacuum transport apparatus according to a yet further embodiment of the present invention.

As described in the foregoing description of the embodiments, the controller 93 in the controller box 9 has a heat generating source such as a circuit board on which a control circuit and other circuits are mounted. Further, the controller box 9 includes such heat generating sources as the coil 222 of the secondary side electromagnet 22, the rectification circuit and the transmitter 95. Since the inside of the controller box 9 is airtightly communicated with the inside of the driving box 91 and the inside of the cable duct 92 while the outside of the controller box 9 is maintained in reduced pressure, heat generated from such heat generating sources as mentioned above is not radiated if no countermeasure is taken for heat radiation. If the controller box 9 is placed into a high temperature state by heat generated from such heat generating sources as mentioned above, then there is the possibility that the circuit board, coils or the like may be damaged or a fault may occur with operation of them. Therefore, the vacuum transport apparatus according to the present embodiment has a cooling mechanism 13 for cooling the controller box 9.

Referring to FIG. 17, the cooling mechanism 13 is provided on the upper face 111 of the partition wall 11. The position at which the cooling mechanism 13 is provided corresponds to a home position of the transport robot 10. Since the period of time within which the controller box 9 which moves integrally with the transport robot 10 stands by at the home position is comparatively long, where the cooling mechanism 13 is provided at the home position, the controller box 9 is cooled efficiently.

The cooling mechanism 13 includes a low temperature section 131 in the form of a thermal conductor, a cooling section 132, a bellows 133, and an actuator 134.

The bellows 133 is provided such that an upper end thereof covers an opening of the upper face 111 of the partition wall 11 from the inner face side of the partition wall 11 and is capable of expanding and contracting in a direction toward the controller box 9, that is, in the Z direction in FIG. 17. The lower end of the bellows 133 is closed up with the low temperature section 131. In particular, the bellows 133 and the low temperature section 131 form part of the upper face 111 of the partition wall 11 and defines the inside and the outside of the vacuum chamber 1. The cooling section 132 is connected to the low temperature section 131 in the inside of the bellows 133 which is the atmospheric pressure side and cools the low temperature section 131. The cooling section 132 may be provided such that it projects from the inside to the outside, which is the atmospheric pressure side, of the bellows 133.

The actuator 134 drives the low temperature section 131 to move back and forth with respect to the controller box 9. The actuator 134 may typically be of the mechanical type which uses, for example, ball screw driving, rack-and-pinion driving or belt driving.

A heat pipe 135 is provided on an upper face of the controller box 9. Operating fluid of an evaporation portion 135*a* of the heat pipe 135 is evaporated by heat generated from the controller box 9 and moves to and is condensed by a condensation portion 135*b*.

If the transport robot 10 is stopped at the home position by the cooling mechanism 13 having such a configuration as described above, then the low temperature section 131 is brought into contact with the condensation portion 135*b* of the heat pipe 135 by driving of the actuator 134. Through this contact, heat of the controller box 9 is collected to the condensation portion 135*b* and radiated to the outside of the vacuum chamber 1. Accordingly, where the low temperature section 131 is contacted with the controller box 9, the controller box 9 can be cooled efficiently by heat conduction.

Figure 18A:
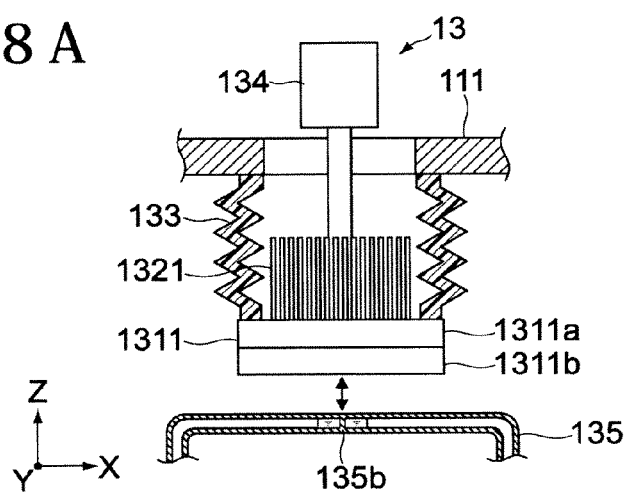
FIGS. 18A to 18C are views showing specific examples of a low temperature section and a cooling section of a cooling mechanism shown in FIG. 17.
Figure 18B:
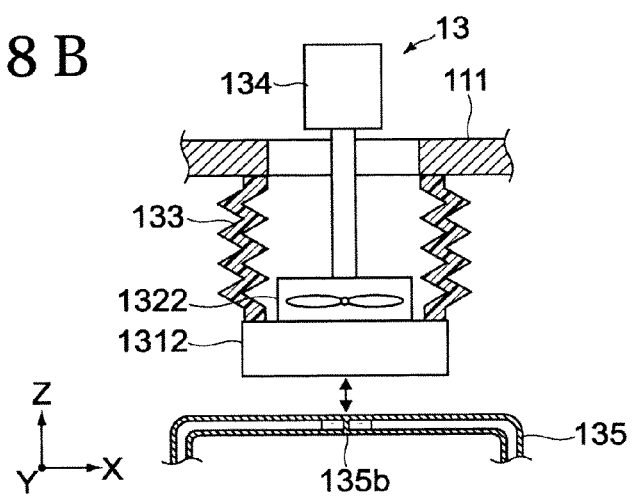
Figure 18C:
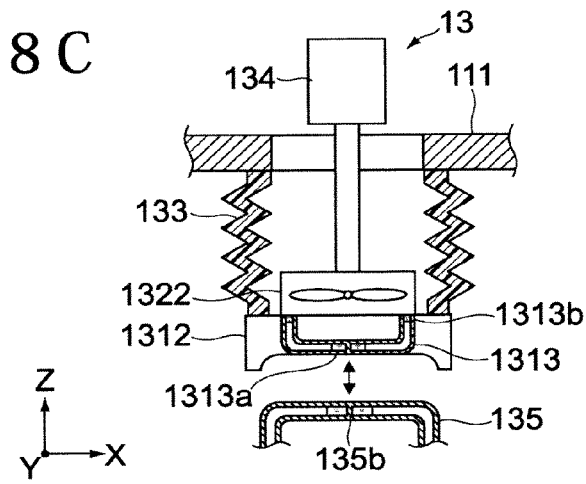

FIGS. 18A to 18C show specific examples of the low temperature section 131 and the cooling section 132 of the cooling mechanism 13.

The low temperature section 131 may be formed from a Peltier element 1311 as shown in FIG. 18A. In this instance, a heat radiating portion 1311*a* of the Peltier element 1311 is provided on the atmospheric air side while a heat absorbing portion 1311*b* of the Peltier element 1311 is provided on the vacuum side. The heat radiating portion 1311*a* is cooled by the cooling section 132. Where the low temperature section 131 is the Peltier element 1311, since the contacting portions of the cooling mechanism 13 and the controller box 9 can normally be kept at a low temperature, the cooling efficiency can be enhanced.

The low temperature section 131 may be formed from a metal block 1312 having a high heat conductivity such as, for example, copper as shown in FIG. 18B. Where the low temperature section 131 is made of metal, since it is simple in structure, the cost of the cooling mechanism 13 can be reduced.

The low temperature section 131 may incorporate a heat pipe 1313 therein as shown in FIG. 18C. In this instance, an evaporation portion 1313*a* of the heat pipe 1313 is disposed in contact with the condensation portion 135*b* of the heat pipe 135 provided on the upper face of the controller box 9 while a condensation portion 1313*b* of the heat pipe 1313 is disposed in contact with the cooling section 132 (1322). Consequently, heat can be transmitted efficiently from the condensation portion 135*b* of the heat pipe 135 provided on the upper face of the controller box 9 to the cooling section 132 (1322). Further, as shown in FIG. 18C, the low temperature section 131 (1312) may be shaped in a corresponding relationship to the shape of the heat pipe 135 so that the low temperature section 131 may contact tightly with the heat pipe 135 on the controller box 9. Further, in this instance, also the heat pipe 135 on the controller box 9 is formed in a size corresponding to the shape of the low temperature section 131 (1312). Consequently, the heat conduction efficiency can be further enhanced.

Although the cooling section 132 may be formed from, for example, an air cooling apparatus such as a fan, a water cooling apparatus, a heat pipe, a heat sink or a cryopump, it is not limited to any one of them. FIG. 18A shows an example wherein a heat sink 1321 is adopted as the cooling section 132, and FIGS. 18B and 18C show an example wherein a fan 1322 is adopted as the cooling section 132.

Although, in the present embodiment, the heat pipe 135 is provided in the vacuum chamber 1, it may otherwise be provided so as to extend from the controller box 9 and between the inside and the outside of the vacuum chamber 1. In particular, the evaporation portion 135a of the heat pipe 135 may be connected to the controller box 9 while the heat pipe 135 extends through the partition wall 11 such that the condensation portion 135b is provided outside the vacuum chamber 1. In this instance, the cooling mechanism 13 is provided outside the vacuum chamber 1, and the controller box 9 is cooled through contact of the low temperature section 131 with the condensation portion 135b of the heat pipe 135.

Figure 19:
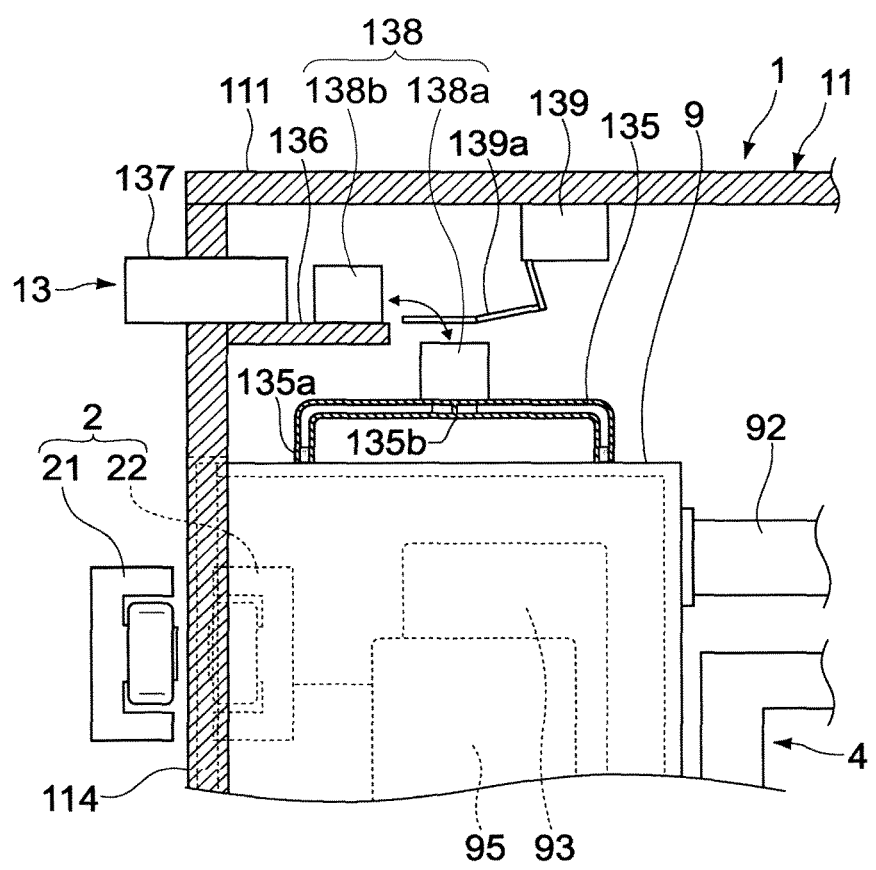
FIG. 19 is a sectional view showing part of a vacuum transport apparatus according to a yet further embodiment of the present invention.

FIG. 19 shows a cross section of a vacuum transport apparatus according to a yet further embodiment of the present invention. It is to be noted that like elements to those of the embodiment described hereinabove with reference to FIGS. 17 and 18A to 18C are denoted by like reference symbols, and overlapping description of them is omitted herein.

Referring to FIG. 19, the cooling mechanism 13 includes a low temperature body 138 made of a thermal conductor, a low temperature body receiving section 136, a cooling section 137 and an actuator 139.

The low temperature body 138 is made of, for example, a metal having a high thermal conductivity such as copper, and two such low temperature bodies 138 (138a and 138b) are prepared. The low temperature body receiving section 136 is provided, for example, on the side face 114 of the partition wall 11 in the inside of the vacuum chamber 1, and the low temperature body 138 is placed on the low temperature body receiving section 136. The low temperature body receiving section 136 may be provided as part of the partition wall 11 or may be provided as a plate member of a thermal conductor separate from the partition wall 11 and connected to the partition wall 11. The cooling section 137 cools a low temperature body 138 placed on the low temperature body receiving section 136 through thermal conduction. A heat pipe 135 similar to that described hereinabove with reference to FIGS. 17 and 18A to 18C is provided on the upper face of the controller box 9 such that a low temperature body 138 can be placed on the heat pipe 135. The actuator 139 actuates a transport arm 139a to transport the low temperature body 138 between the low temperature body receiving section 136 and the heat pipe 135.

Since the cooling mechanism 13 has such a configuration as described above, the low temperature body 138 placed on the low temperature body receiving section 136 and cooled by the cooling section 137 is transported onto the heat pipe 135 by the actuator 139 so that the controller box 9 is cooled through thermal conduction. While the low temperature body 138a is placed on the heat pipe 135, the low temperature body 138b for exchange is placed on the low temperature body receiving section 136 and cooled as shown in FIG. 19. The low temperature body 138a placed on the heat pipe 135 cools the controller box 9 while the transport robot 10 and the controller box 9 continue to be driven. If the transport robot 10 stops at the home position, then the heated low temperature body 138a on the heat pipe 135 is exchanged for the cooled low temperature body 138b on the low temperature body receiving section 136 by transporting operation of the actuator 139. The low temperature body 138b placed on the heat pipe 135 cools the controller box 9, and the low temperature body 138a placed on the low temperature body receiving section 136 is cooled by the cooling section 137.

Since such a series of operations as described above are repeated, the controller box 9 is normally cooled irrespective of whether or not the controller box 9 is at the home position, the cooling efficiency can be enhanced.

Figure 20A:
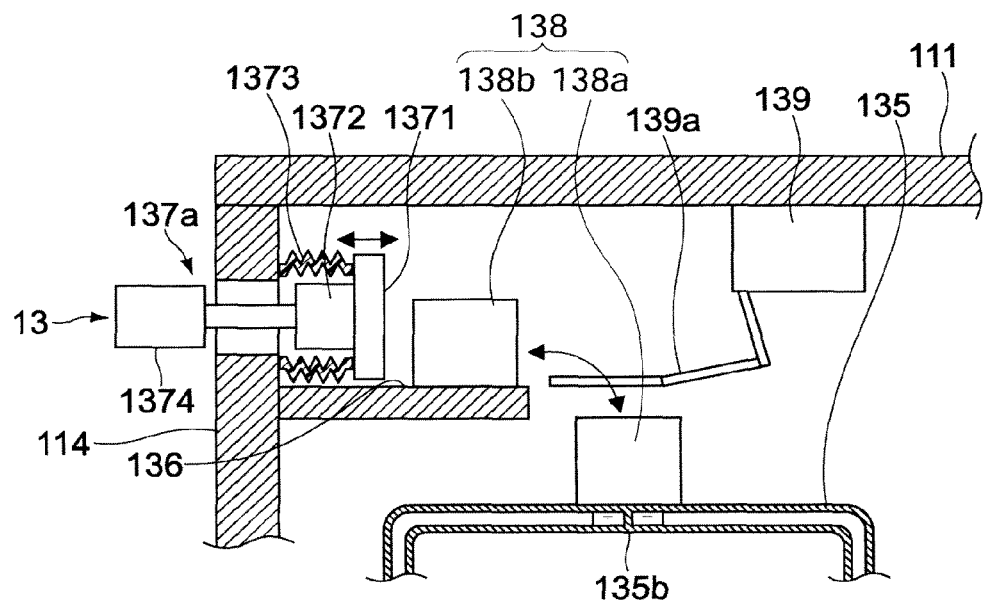
FIGS. 20A and 20B are sectional views showing specific examples of a cooling section of a cooling mechanism shown in FIG. 19.
Figure 20B:
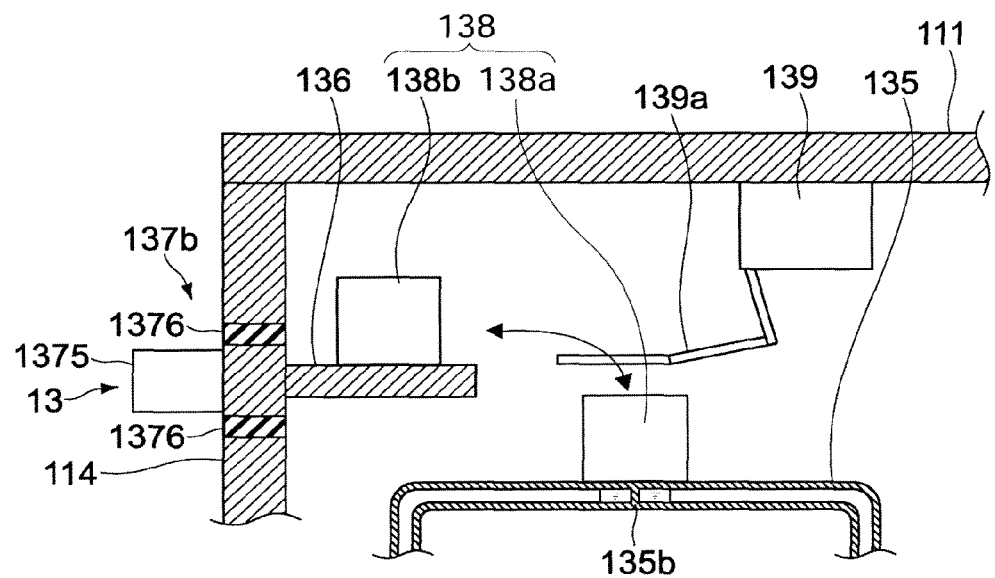

FIGS. 20A and 20B show specific examples of the cooling section 137 of the cooling mechanism 13 shown in FIG. 19.

As shown in FIG. 20A, the cooling section 137 may be configured, for example, similarly to that described hereinabove with reference to FIGS. 17 and 18A to 18C. In particular, the cooling section 137 has a low temperature section 1371, a cooling apparatus 1372, a bellows 1373 and an actuator 1374. The low temperature section 1371 is formed from a Peltier element, a metal block or the like. The bellows 1373 is connected to the low temperature section 1371 to form the partition wall 11 together with the low temperature section 1371. The cooling apparatus 1372 is an air cooling apparatus such as, for example, a fan, a water cooling apparatus, a heat pipe, a heat sink, a cryopump or the like and is connected to the low temperature section 1371 on the atmospheric pressure side. The actuator 1374 drives the low temperature section 1371 to move toward and away from the low temperature body 138 and cools the low temperature body 138 through thermal conduction when it contacts with the low temperature body 138.

As shown in FIG. 20B, the cooling section 137 may be configured so as to have a cooling apparatus 1375 and a thermally insulating section 1376. The cooling apparatus 1375 is an air cooling apparatus such as, for example, a fan, a water cooling apparatus, a heat pipe, a heat sink, a cryopump or the like and is connected to the partition wall 11. The thermally insulating section 1376 is made of a suitable one of various heat insulating materials and is embedded in the partition wall 11 so as to restrict the thermal conduction by the cooling apparatus 1375 to a predetermined range. When the partition wall 11 is cooled by the cooling apparatus 1375, the low temperature body 138 is cooled by thermal conduction through the low temperature body receiving section 136.

In the embodiments shown in FIGS. 17 to 21, the heat pipe 135 is provided for the controller box 9. However, the heat pipe 135 may not be provided such that the low temperature section 131 or the low temperature body 138 contacts directly with the upper face of the controller box 9.

Figure 21:
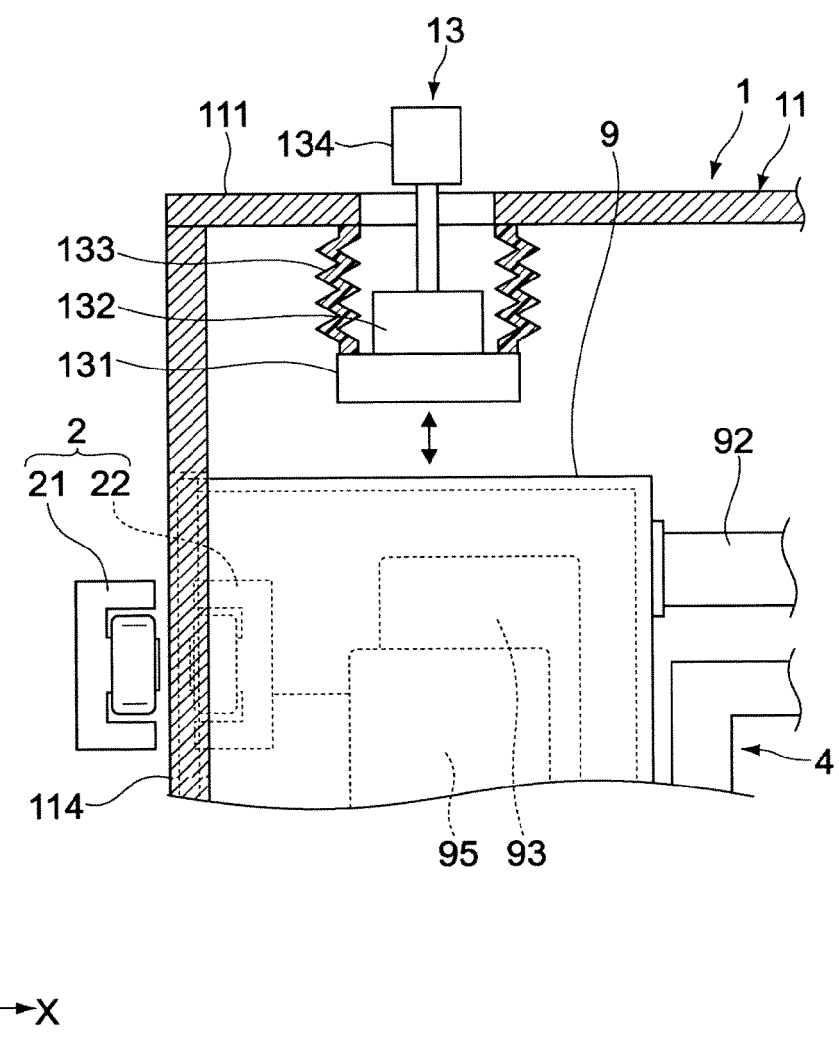
FIGS. 21 and 22 are sectional views showing part of vacuum transport apparatus according to yet further different embodiments of the present invention.

FIG. 21 shows an embodiment wherein a cooling mechanism similar to the cooling mechanism 13 described hereinabove with reference to FIGS. 17, 18A to 18C does not include a heat pipe for the controller box 9. In this instance, the low temperature section 131 directly contacts with the upper face of the controller box 9 by back and forth driving movement by the actuator 134.

Figure 22:
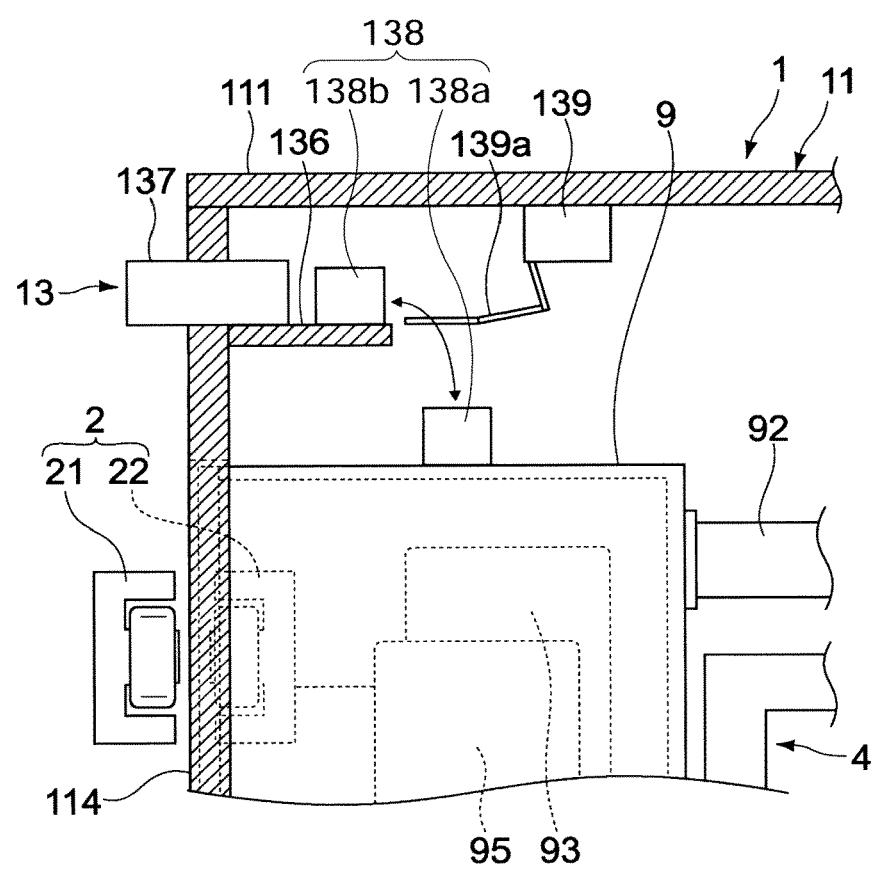

FIG. 22 shows an embodiment wherein a cooling mechanism similar to the cooling mechanism 13 described hereinabove with reference to FIGS. 19, 20A and 20B does not include a heat pipe for the controller box 9. In this instance, the low temperature body 138 is placed directly on the upper face of the controller box 9 through transport driving of the actuator 139.

In this manner, the cooling mechanism 13 can cool the controller box 9 efficiently through thermal conduction by causing the low temperature section 131 (FIG. 21) or the low temperature body 138 (FIG. 22) to contact directly with the controller box 9 made of a material having a high heat conductivity such as metal. For a high cooling efficiently, the face of the low temperature section 131 and the low temperature body 138 for contacting with the controller box 9 should be formed as wide as possible.

In the embodiments described above with reference to FIGS. 17 to 22, the cooling mechanism 13 is provided at a position of the upper face 111 or the side face 114 of the partition wall 11 which corresponds to the home position of the transport robot 10. However, the position at which the cooling mechanism 13 is provided can be suitably changed depending upon the installation position of the controller box 9 and other mechanisms. In particular, the cooling mechanism 13 may be provided on the side face 114 or the side face 115 or may be provided at a position which does not correspond to the home position, for example, on the front face 112 or the rear face 113. Further, the cooling mechanism 13 may be provided at a plurality of locations including a position corresponding to the home position.

Figure 23:
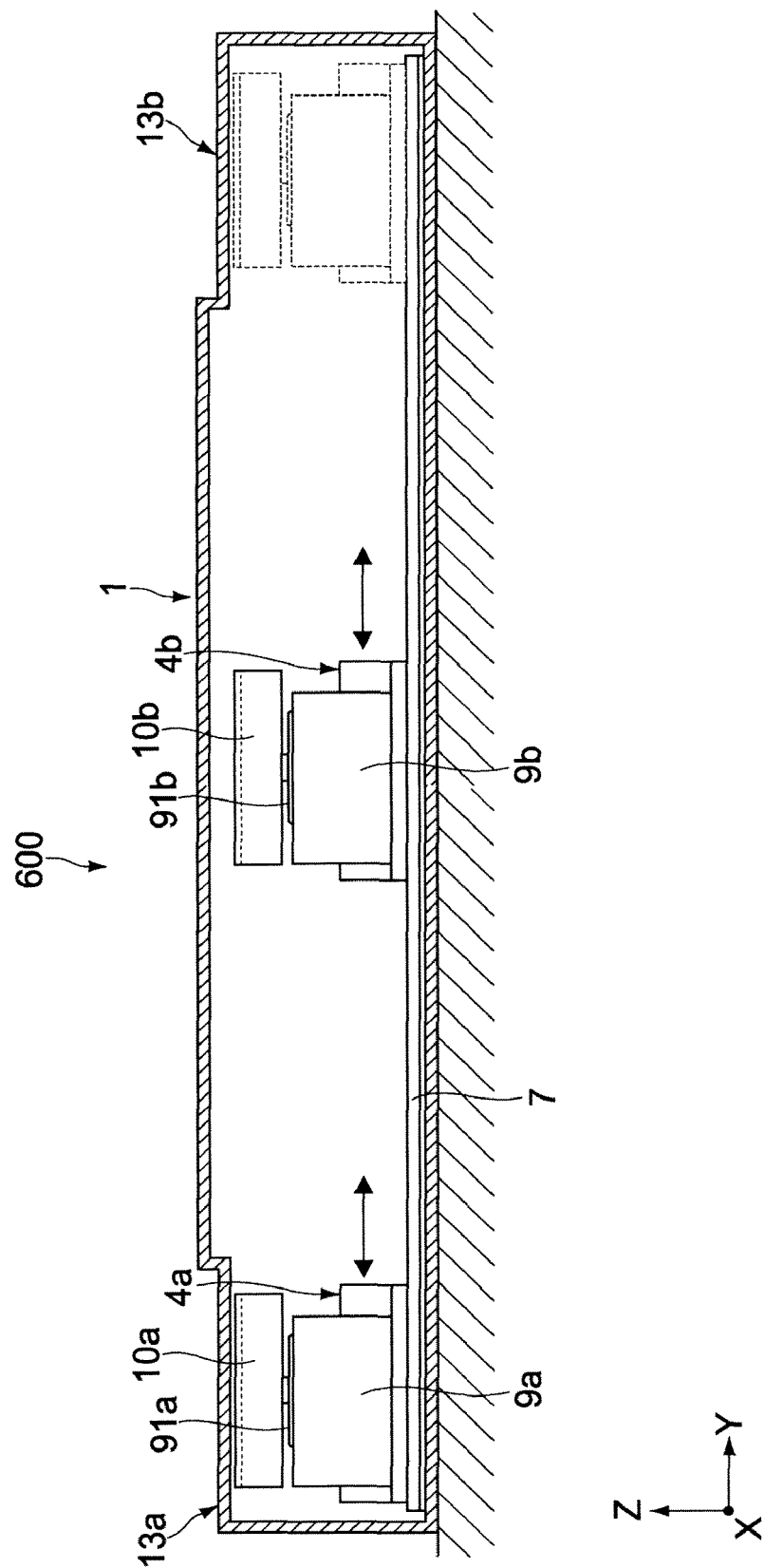
FIG. 23 is a sectional view of a vacuum transport apparatus of a yet further embodiment of the present invention as viewed in the direction of an X axis.

FIG. 23 shows a cross section of a vacuum transport apparatus 600 according to a yet further embodiment of the present invention as viewed in the X-axis direction.

Referring to FIG. 23, the vacuum transport apparatus 600 according to the present embodiment includes two moving bodies each moved by a linear motor 5 and each including a support table 4, a transport robot 10, a driving box 91, a controller box 9 and so forth. The vacuum transport apparatus 600 has, at the opposite ends in the vacuum chamber 1 in the Y-axis direction, that is, at the opposite ends of the movement of the moving bodies, cooling mechanisms 13 (13*a* and 13*b*) as cooling stations for cooling the controller boxes 9*a* and 9*b* of the moving bodies. Each of the cooling mechanisms 13 may be configured adopting any of the configurations described hereinabove with reference to FIGS. 17 to 22.

In the vacuum transport apparatus 600 having such a configuration as described above, during movement of the controller box 9*b*, the other controller box 9*a* is cooled by the cooling mechanism 13*a*. If the controller box 9*a* is cooled for a fixed period of time, then the power supply of the linear motor 5 is exchanged between the controller box 9*a* and the controller box 9*b* and now the controller box 9*a* is driven by the linear motor 5. The controller box 9*b* is now moved to the cooling mechanism 13*b* at the other end in the vacuum chamber 1 and cooled by the cooling mechanism 13*b*. Consequently, the controller boxes 9*a* and 9*b* can be cooled continuously individually in a stationary state by the cooling mechanisms 13*a* and 13*b* as cooling stations, respectively. Accordingly, by using the two moving bodies, the transport efficiency of semiconductor wafers can be enhanced and the controller boxes 9*a* and 9*b* can be cooled with certainty without stopping driving of the transport robot 10.

While, in the present embodiment described, the two moving bodies move linearly, two cooling mechanisms 13 may be provided similarly also in a vacuum transport mechanism wherein, for example, two moving bodies move annularly or radially. Further, although the number of moving bodies is not limited to two, where three or more moving bodies are used, three or more cooling mechanisms 13 may be provided correspondingly.

Figure 24:
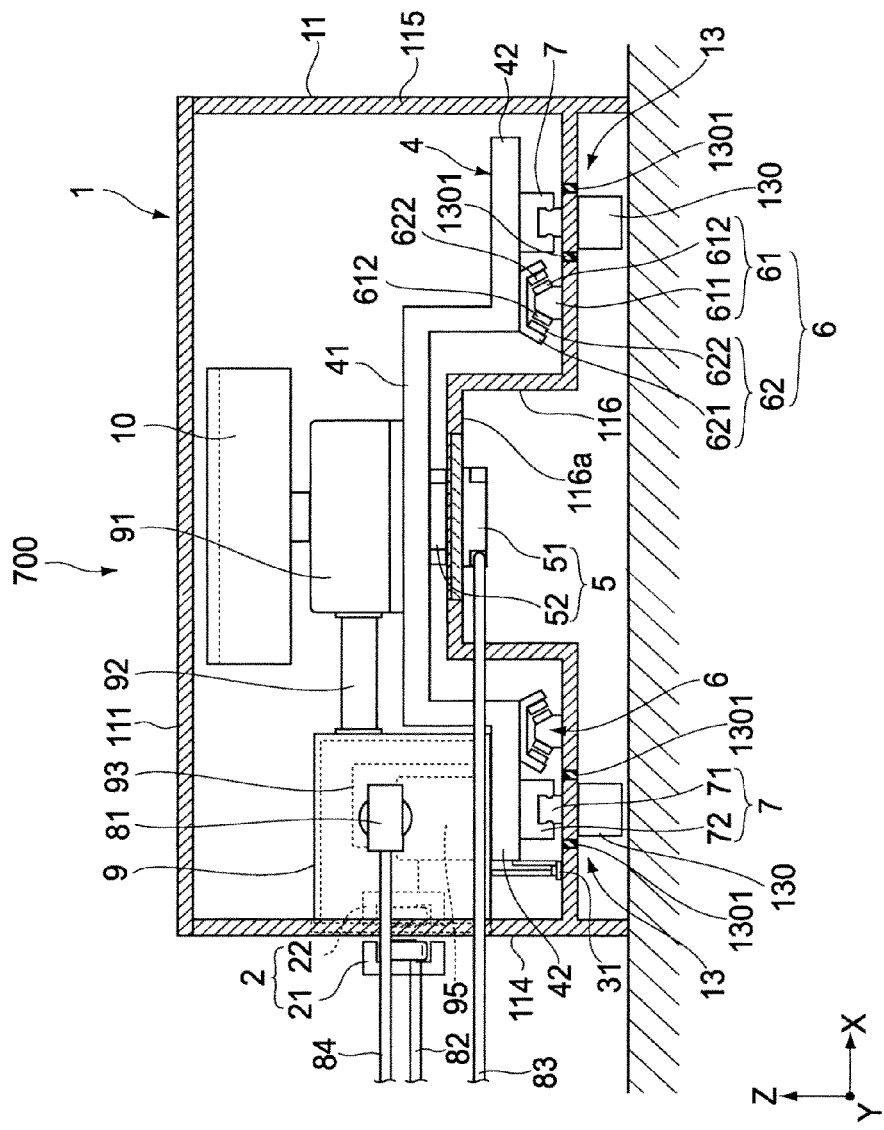
FIG. 24 is a sectional view of a vacuum transport apparatus of a yet further embodiment of the present invention as viewed in the direction of a Y axis.

FIG. 24 shows a cross section of a vacuum transport apparatus 700 according to a yet further embodiment of the present invention as viewed in the Y-axis direction.

Referring to FIG. 24, the cooling mechanism 13 of the vacuum transport apparatus 700 according to the present embodiment includes a cooling apparatus 130 and a thermally insulating section 1301.

In particular, the cooling apparatus 130 is provided at each of positions of the bottom face of the partition wall 11 which correspond to the two linear guides 7. The bottom face of the partition wall 11 may be raised to produce a space, in which the cooling apparatus 130 are provided. The cooling apparatus 130 may be formed using any of an air cooling apparatus such as, for example, a fan, a water cooling apparatus, a heat pipe, a heat sink, a cryopump and so forth. The thermally insulating sections 1301 are made of any of various heat insulating materials and are embedded in the bottom face of the partition wall 11 such that thermal conduction by the cooling apparatus 130 is restricted to a predetermined range.

Where the cooling mechanisms 13 having such a configuration as described above are used, if the bottom face of the partition wall 11 is cooled by the cooling apparatus 130, then the controller box 9 is cooled by thermal conduction through the linear guides 7 and the support table 4 made of a heat conducting material such as a metal. Accordingly, the cooling mechanisms 13 can cool the controller box 9 indirectly making use of the linear guides 7 originally necessary for the guidance of the moving bodies by the linear motor 5. Simultaneously, by cooling the linear guides 7, also a fault such as deformation of the linear guides 7 by thermal expansion can be prevented.

In the present embodiment, two cooling mechanisms 13 are provided so as to correspond to the two linear guides 7. However, only one cooling mechanism 13 may be provided, for example, so as to correspond to that one of the linear guides 7 which is nearer to the controller box 9, or only one cooling mechanism 13 may be provided so as to cool both of the two linear guides 7 at the same time. Further, the cooling mechanism 13 may be configured so as to cool the controller box 9 through a thermally conductive member other than the linear guides 7 which is provided on the bottom face or any other face of the partition wall 11.

In the present embodiment, the linear guides 7 are provided in the vacuum chamber 1, and the cooling apparatus 130 cools the linear guides 7 through the partition wall 11. However, where the linear guides 7 are provided so as to extend between the inside and the outside of the vacuum chamber 1, that is, where the linear guides 7 are exposed to the outside of the vacuum chamber 1, the cooling apparatus 130 may be connected directly to the exposed portions of the linear guides 7.

Figure 25:
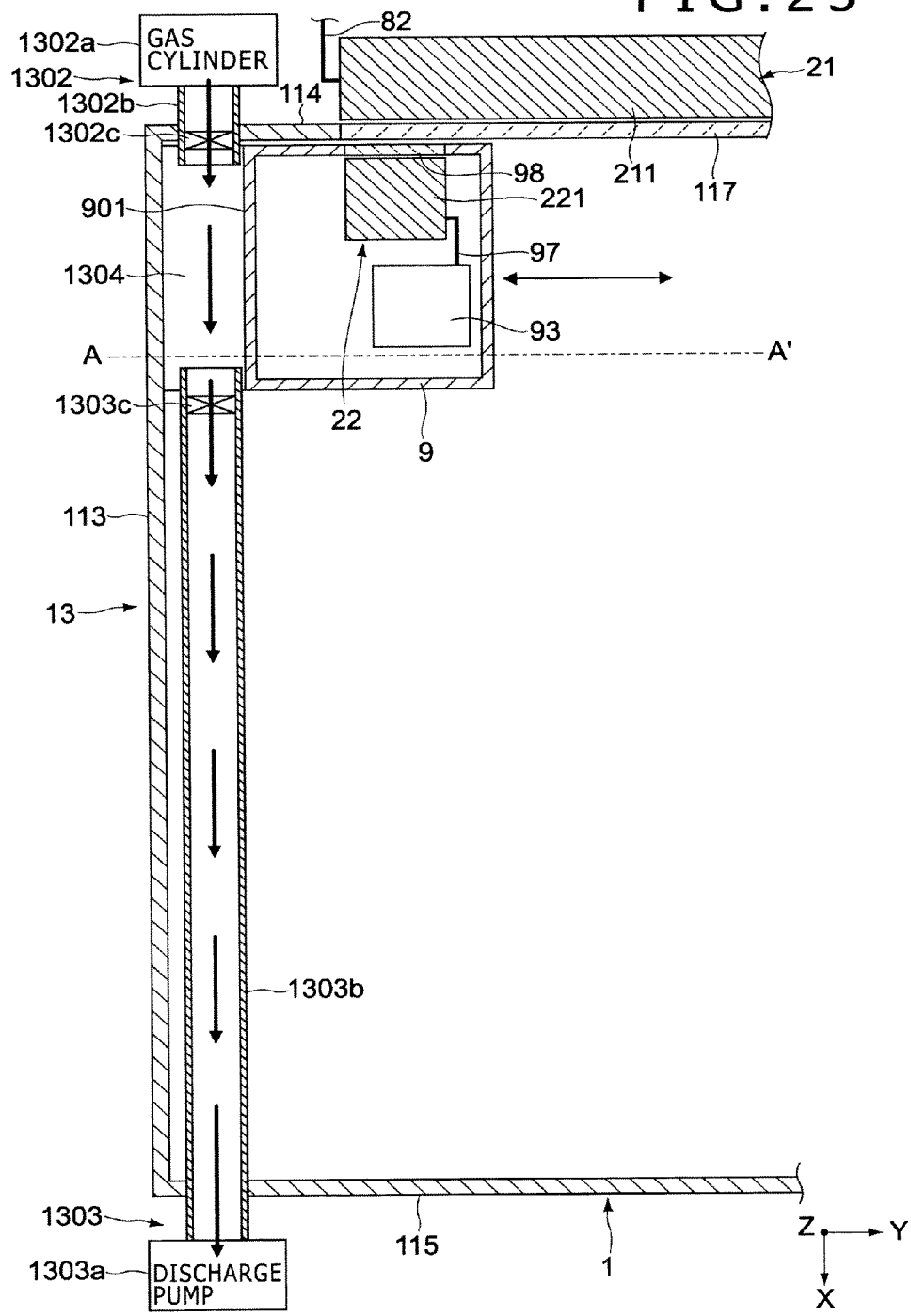
FIG. 25 is a sectional view of a vacuum transport apparatus of a yet further embodiment of the present invention as viewed in the direction of a Z axis.
Figure 26:
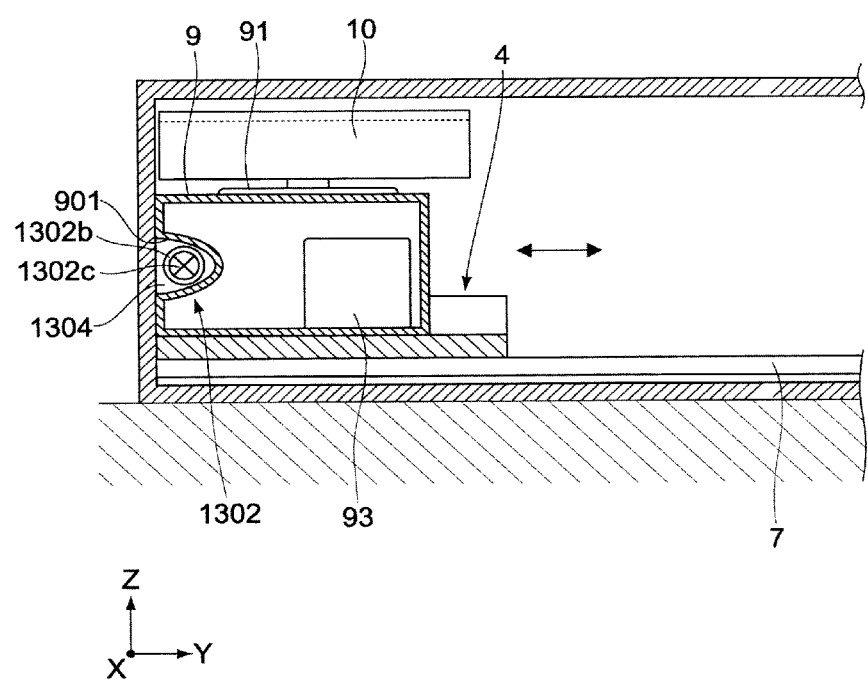
FIG. 26 is a sectional view taken along line A-A' of the vacuum transport apparatus shown in FIG. 25.

FIG. 25 shows a cross section of part of a vacuum transport apparatus according to a yet further embodiment of the present invention as viewed in the Z-axis direction. FIG. 26 shows a cross section of the vacuum transport apparatus of FIG. 25 taken along the A-A' direction.

Referring to FIGS. 25 and 26, the cooling mechanism 13 in the present embodiment includes an introduction mechanism 1302 provided on the side face 114 of the partition wall 11 and a discharging mechanism 1303 provided on the side face 115 of the partition wall 11. Further, in the present embodiment, the moving body which includes the controller box 9 and the transport robot 10 is movable in the Y axis direction until it is brought into contact with the rear face 113 of the partition wall 11. The position at which the moving body contacts with the rear face 113 of the partition wall 11 is set to one of home positions of the moving body.

The introduction mechanism 1302 has a gas cylinder or tank 1302*a*, an introduction pipe 1302*b*, and an electromagnetic valve 1302*c*. The gas cylinder 1302*a* stores low temperature gas therein. The introduction pipe 1302*b* is provided so as to extend through the side face 114 to communicate the inside of the gas cylinder 1302*a* and the inside of the partition wall 11 with each other to introduce low temperature gas into the inside of the partition wall 11. Although the exit of the introduction pipe 1302*b* is positioned, for example, on the rather inner side than the side face of the controller box 9 adjacent the side face 114. However, the position of the exit of the introduction pipe 1302*b* is not limited to this. The electromagnetic valve 1302*c* is provided in the proximity of the exit of the introduction pipe 1302*b* and has an electromagnet and a plunger not shown such that the introduction pipe 1302*b* is opened and closed by electromagnetic force.

The low temperature gas is inert gas such as, for example, nitrogen gas, helium gas or argon gas of a low temperature. However, the low temperature gas is not limited to any of them, but only it is necessary for the temperature of the low temperature gas to be lower than the temperature of the controller box 9.

The discharging mechanism 1303 has a discharge pump 1303*a*, a discharge pipe 1303*b* and an electromagnetic valve 1303*c*. The discharge pump 1303*a* discharges low temperature gas introduced into the partition wall 11 to the outside of the partition wall 11. The discharge pipe 1303*b* is provided so as to extend through the side face 115 and communicates the inside of the discharge pump 1303*a* and the inside of the partition wall 11 with each other to supply low temperature gas to the discharge pump 1303*a*. Although the entrance of the discharge pipe 1303*b* is disposed, for example, on the rather inner side than the side face of the controller box 9 adjacent the side face 115, the position of the entrance is not limited to this. The electromagnetic valve 1303*c* opens and closes the discharge pipe 1303*b* by electromagnetic force similarly to the electromagnetic valve 1302*c*.

In the present embodiment, the face of the controller box 9 which opposes to the rear face 113 of the partition wall 11 is so shaped that it cooperates with the rear face 113 to form a flow channel 1304 for low temperature gas introduced in the partition wall 11 in such a manner as described above. In particular, the face of the controller box 9 opposing to the rear face 113 has a cutaway portion 901 of, for example, a semi-elliptic cylinder. The cutaway portion 901 is formed in such a manner as to cover the cross section of the introduction pipe 1302*b* and the discharge pipe 1303*b* in the X-axis direction as seen in FIG. 26. Further, a portion of the face of the controller box 9 opposing to the rear face 113 except the cutaway portion 901 can contact with the rear face 113, and therefore, in this instance, leakage of gas from the flow channel 1304 can be prevented to the utmost. The shape of the cutaway portion 901 is not limited to the semi-elliptic cylindrical shape but a circular cylindrical shape, a prism shape or some other shape. Or, the controller box 9 may have a wall member which defines the flow channel 1304 in place of the cutaway portion 901.

In the cooling mechanism 13 configured in such a manner as described above, if the controller box 9 moves to the home position at which it contacts with the rear face 113 of the partition wall 11, then the electromagnetic valve 1302*c* in the introduction pipe 1302*b* of the introduction mechanism 1302 is opened and low temperature gas flows from the introduction pipe 1302*b* into the flow channel 1304. The flow rate of the low temperature gas when it flows into the flow channel 1304 is, for example, approximately several tens cc/seconds. However, the flow rate is not limited this. Together with this operation, also the electromagnetic valve 1303*c* in the discharge pipe 1303*b* of the discharging mechanism 1303 is opened, and low temperature gas is discharged from the discharge pipe 1303*b* to the outside of the partition wall 11 by the discharge pump 1303*a*. The flow rate of the low temperature gas upon discharging is set higher than the flow rate upon flowing in.

Consequently, since low temperature gas flows in the proximity of the rear face 113 and the cutaway portion 901 of the controller box 9, it directly touches with the controller box 9 thereby to efficiently cool the controller box 9 through thermal conduction. Further, since the low temperature gas touches with the rear face 113, the rear face 113 is cooled and the controller box 9 held in contact with the rear face 113 is cooled indirectly by thermal conduction through the rear face 113.

Since the low temperature gas flowing into the flow channel 1304 is nitrogen gas or inert gas flowing at a flow rate of approximately several tens cc/seconds, even if the discharge pump 1303*a* fails to discharge the low temperature gas and the low temperature gas overflows in the vacuum chamber 1, the vacuum chamber 1, a transport object such as a wafer and other members are little influenced by this.

In the present embodiment, a heat pipe may be provided for the controller box 9. In this instance, the condensation side of the heat pipe may be provided in the proximity of the cutaway portion 901. Where the condensation side of the heat pipe is provided in this manner, when the low temperature gas touches with the condensation side of the heat pipe, heat of the controller box 9 is collected to the condensation side of the heat pipe. Consequently, the cooling efficiency of the controller box 9 is further improved.

In the present embodiment, when the controller box 9 is to be cooled, it moves to the position at which it contacts with the rear face 113 of the partition wall 11. However, only if the rear face 113 and the cutaway portion 901 achieve the function as the flow channel 1304, the controller box 9 need not necessarily contact with the rear face 113.

While, in the present embodiment, the introduction mechanism 1302 and the discharging mechanism 1303 are provided on the rear face 113 side of the partition wall 11, they may otherwise be provided on any other face of the partition wall 11 such as the front face 112.

While, in the present embodiment, the electromagnetic valves 1302*c* and 1303*c* are used to open and close the introduction pipe 1302*b* and the discharge pipe 1303*b*, any other valve such as, for example, an electric-operated valve may be used instead.

In the embodiments described hereinabove with reference to FIGS. 17 to 26, the cooling mechanism 13 is provided in order to cool the controller box 9. However, the cooling mechanism 13 can be applied also to cool any other heat generating source in the vacuum chamber 1 such as, for example, the coils 512 of the linear motor 5.

In the embodiments described hereinabove with reference to FIGS. 17 to 26, the cooling mechanism 13 is applied to a vacuum transport apparatus which includes the transport robot 10 moved by the linear motor 5. However, the cooling mechanism 13 can be applied similarly, for example, also to a vacuum apparatus which includes an X-Y stage for moving a processing object two-dimensionally, a vacuum apparatus which includes a processing unit for rotationally processing a projecting object or a like vacuum apparatus. In particular, the cooling mechanism 13 can be applied to any apparatus irrespective of whether or not a heat generating source moves only if it is configured such that it cools a vessel such as a box or a chamber which airtightly accommodates the heat generating source with a pressure higher than the pressure in the vacuum chamber.

Figure 27:
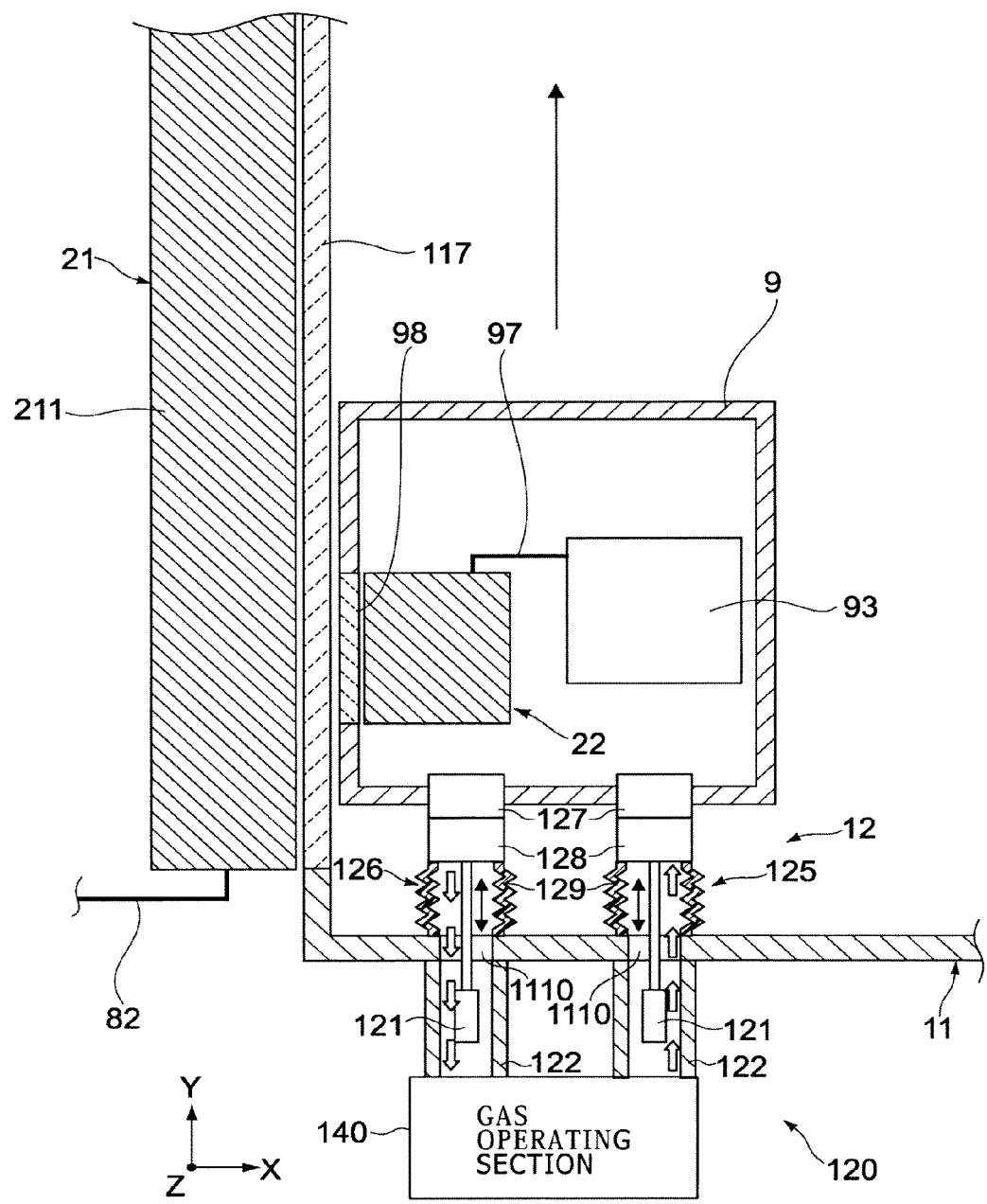
FIG. 27 is a sectional view showing part of a vacuum transport apparatus according to a yet further embodiment of the present invention.

FIG. 27 shows a cross section of part of a vacuum transport apparatus according to a yet further embodiment of the present invention.

Referring to FIG. 27, the vacuum transport apparatus according to the present embodiment includes an exchanging mechanism 120 for exchanging gas heated by a heat generating source such as the coils 222 and/or the controller 93 in the controller box 9 for gas of a temperature lower than that of the heated gas in order to cool the inside of the controller box 9.

The exchanging mechanism 120 has two distribution pipes 12 for connecting the inside of the controller box 9 and the inside of the partition wall 11 to each other so as to establish communication between them. The distribution pipes 12 are provided, for example, on the rear face 113 of the partition wall 11 and have an introduction pipe 125 and a discharge pipe 126 of gas provided on the inner face side of the partition wall 11 and a pair of box side connectors 127 individually connected to the introduction pipe 125 and the discharge pipe 126. The two box side connectors 127 may have the substantially same structure, and also the introduction pipe 125 and the discharge pipe 126 may have the substantially same structure.

The introduction pipe 125 (and the discharge pipe 126) has a bellows 129 provided on the partition wall 11 side and connected to a through-hole 1110 through which gas circulates and a partition wall side connector 128 attached to an end of the bellows 129. The box side connectors 127 are attached to a predetermined wall face of the controller box 9 and individually removably connected to the partition wall side connectors 128 to establish communication between the inside and the outside of the controller box 9.

A pair of pipes 122 are connected to the through-holes 1110 of the partition wall 11 in such a manner as to extend to the outside of the partition wall 11 through the through-holes 1110. A gas operating section 140 is connected to the pipes 122, and introduces cooling gas into the inside of the controller box 9 through the introduction pipe 125 and discharges gas in the controller box 9 to the outside of the partition wall 11 through the discharge pipe 126. The gas operating section 140 has, for example, a heat exchanger, a pump for applying power to gas and so forth not shown.

For the air introduced from the gas operating section 140, typically the air or inert gas is used. For the inert gas, for example, nitrogen, argon, helium or neon is used. Although the temperature of the cooling gas is, for example, 0 to 30° C., only it is necessary for the temperature of the cooling gas to be lower than the temperature of the gas in the controller box 9 which includes heat from the heat generating source, and the temperature of the cooling gas is not limited to that within the range specified above.

An actuator 121 for moving the partition wall side connector 128 toward and away from the controller box 9 side is connected to each of the partition wall side connectors 128. While the actuators 121 are individually disposed, for example, in the pipes 122, they may otherwise be connected to the partition wall side connectors 128 from the outside of the pipes 122 to operate the partition wall side connectors 128. For the actuators 121, typically an actuator of a mechanical type such as, for example, a ball screw actuator, a rack-and-pinion actuator or a belt-drive actuator may be used.

Figure 28:
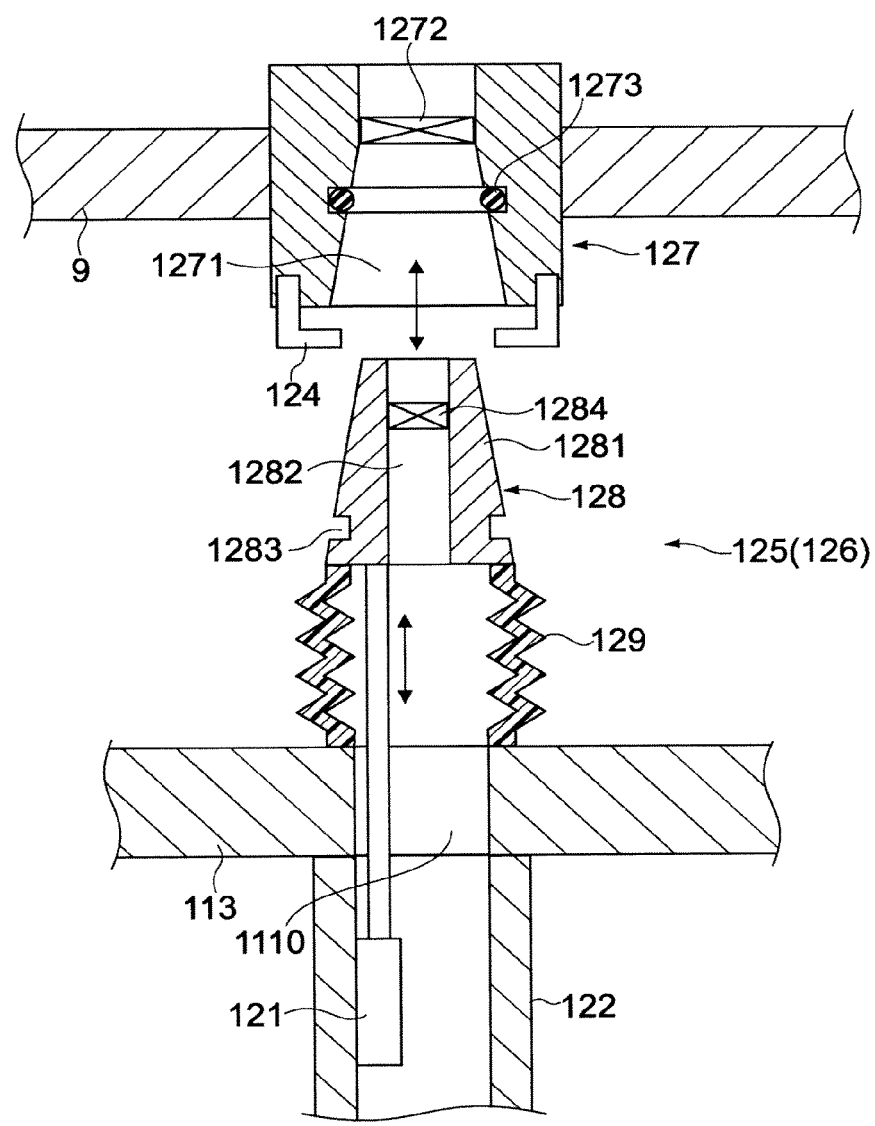
FIG. 28 is a sectional view showing an example of a structure of a partition wall side connector and a box side connector in the vacuum transport apparatus of FIG. 27.

FIG. 28 shows a cross section of an example of a structure of the partition wall side connector 128 and the box side connector 127.

Referring to FIG. 28, the partition wall side connector 128 shown includes a body 1281 having an outer profile of part of a substantially cylindrical or conical shape, and an on-off valve 1284 disposed in a flow channel 1282 in the inside of the body 1281. An engaging groove 1283 is formed on an outer circumferential face of the partition wall side connector 128 such that it is engaged, for example, by a locking member 124 provided on the controller box 9 side.

The box side connector 127 has a hole or flow channel 1271 into which the body 1281 of the partition wall side connector 128 is to be inserted, and has an on-off valve 1272 in the flow channel 1271. A seal member 1273 such as an O-ring is mounted on an inner circumferential face of the box side connector 127. When the body 1281 of the partition wall side connector 128 is inserted into the flow channel 1271 of the box side connector 127, the outer circumferential face of the body 1281 is contacted with the seal member 1273 to close up the flow channels 1282 and 1271. The on-off valves 1284 and 1272 are formed, for example, using an electromagnetic valve.

Figure 29:
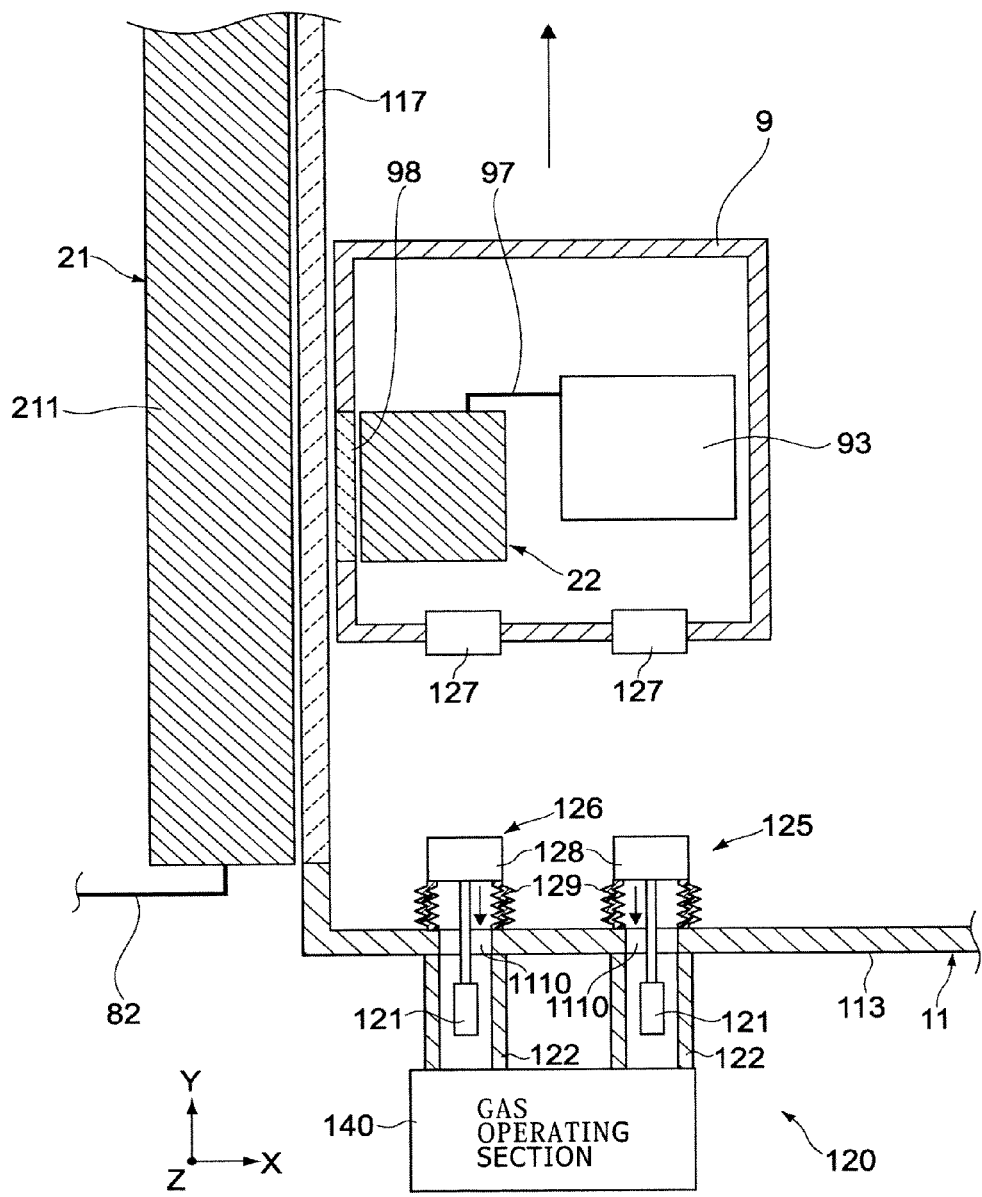
FIG. 29 is a sectional view showing an exchanging mechanism when the partition wall side connector and the box side connector in the vacuum transport apparatus of FIG. 27 are disconnected from each other.

FIG. 29 shows the exchanging mechanism 120 when the connection between the partition wall side connectors 128 and the box side connectors 127 is released. For example, when the moving body including the transport robot 10 and the support table 4 moves, the connection between the partition wall side connectors 128 and the box side connectors 127 is released as seen in FIG. 29.

When the moving body stops and stands by, for example, at the home position described above, as seen in FIG. 27, the actuators 121 individually operate to connect the partition wall side connectors 128 to the box side connectors 127. In the example of FIG. 28, when the actuator 121 operates, the body 1281 of each partition wall side connector 128 is inserted into the flow channel 1271 of the box side connector 127 and locked by the locking member 124. Consequently, the on-off valves 1284 and 1272 are opened. Then, cooling gas is introduced into the controller box 9 from the gas operating section 140 through the introduction pipe 125, and gas heated in the controller box 9 is discharged through the discharge pipe 126.

The introduction pipe 125 and the discharge pipe 126 are mounted on or removed from the controller box 9 in such a manner as described above to exchange the gas for fresh cooling gas.

In the present embodiment, even where the controller box 9 is provided in the vacuum chamber 1, the inside of the controller box 9 can be cooled. Consequently, the problem of a bad influence upon the controller 93 arising from heat of a heat generating source in the controller box 9 is eliminated.

In the present embodiment, since the discharge pipe 126 and the introduction pipe 125 are separate from each other, heated gas and cooling gas can be exchanged efficiently.

In the present embodiment, gases are exchanged not only when the transport robot 10 is positioned at the home position, but the transport robot 10 may be connected to the discharge pipe 126 and the introduction pipe 125 when the transport robot 10 is positioned at some other position than the home position to exchange the gases. The position other than the home position may be, for example, a position at which a processing object is transferred between the vacuum transport apparatus and another processing apparatus or some other position.

A plurality of distribution pipes 12 may be provided, and the introduction pipe 125 and the discharge pipe 126 of at least one of the distribution pipes 12 may be provided at the home position.

While, in the present embodiment described above, the inside of the controller box 9 is taken as an example, the distribution pipe 12 may be connected between at least one of the controller box 9, driving box and movable element box and the partition wall 11.

A bellows, a connector connected to the bellows and an actuator for moving the connector toward and away from the partition wall 11, which are similar to the introduction pipe 125 and the discharge pipe 126 provided on the partition wall 11 side, may be provided on the controller box 9 side. In this instance, a connector similar to the box side connector 127 provided on the controller box 9 side should be provided on the partition wall 11 side.

Gas heated by a heat generating source in the controller box 9 and cooling gas introduced newly into the controller box 9 may be different from each other.

For the joint mechanism which is a component of the partition wall side connector 128 and the box side connector 127, a joint mechanism popularly distributed on the market may be used.

The mode for carrying out the present invention is not limited to the embodiments described hereinabove, but the present invention can be carried out in various other embodiments.

In the embodiments described above, the pressure of the air in the vacuum chamber 1 is decompressed to a predetermined degree of vacuum. However, the gas to be filled in the vacuum chamber 1 is not limited to the air, but inert gas such as nitrogen gas, helium gas, neon gas or argon gas or some other gas may be decompressed. Also the gas in the controller box, driving box and/or movable element box is not limited to the air, and inert gas or some other gas may be used.

In the embodiments described above, the internal pressure of the vessel such as the controller box 9, the driving box 91 or the movable element box 190 is substantially equal to the atmospheric pressure. However, the pressure in the vessels may be higher or lower than the atmospheric pressure within a range within which it does not have a bad influence on the elements accommodated in the vessels.

The principal transport direction of the transport robot 10 is not limited to a linear direction but may be a curved direction or a combination of such directions.

The power supply mechanisms 2, 102, 202, 302 and 402 may be disposed on the upper face 111 or the bottom section 116 of the partition wall 11. The power supply mechanisms 202 and 302 may be disposed on the front face 112 or the rear face 113 of the partition wall 11. Particularly, since, for example, the upper face 111 of the partition wall 11 has a smaller number of apparatus and structures thereon in comparison with the side face 114 and the bottom section 116, it is possible to dispose the primary side electromagnet 21 having an elongated shape as in the embodiment described hereinabove, for example, with reference to FIG. 6 on the upper face 111 of the partition wall 11.

In the foregoing description of the embodiments, the vacuum transport apparatus 100, 300, 400, 500, 600 and 700 which include the transport robot 10 are described. However, the present invention may be applied to a vacuum apparatus which includes a moving body which moves a processing object two-dimensionally like, for example, an X-Y stage or a vacuum apparatus which includes a processing unit which includes operation of rotating a processing object.

To at least one of the vacuum transport apparatus 300, 400, 500, 600 and 700 described hereinabove with reference to FIGS. 11 to 29, one of the power supply mechanism 2, 202, 302 and 402 described hereinabove with reference to FIGS. 7 to 10 may be applied.

Also it is possible to implement a vacuum transport apparatus which includes a combination of at least two of the characteristic portions of the vacuum transport apparatus 100, 300, 400, 500, 600 and 700 described hereinabove with reference to FIGS. 1, 2, and 11 to 29.

The present application contains subject matter related to that disclosed in Japanese Priority Patent Application JP 2008-204826 filed in the Japan Patent Office on Aug. 7, 2008, the entire content of which is hereby incorporated by reference.

While preferred embodiments of the present invention have been described using specific terms, such description is for illustrative purpose only, and it is to be understood that changes and variations may be made without departing from the spirit or scope of the following claims.

What is claimed is:

1. A vacuum processing apparatus, comprising:
   a vacuum chamber configured to maintain a first pressure lower than an atmospheric pressure;
   a driving source disposed in said vacuum chamber and configured to control movement of a processing object;
   an electric power supply mechanism including a primary side mechanism disposed outside said vacuum chamber and a secondary side mechanism disposed in said vacuum chamber, said primary side mechanism being configured to wirelessly transfer electric power to said driving source via said secondary side mechanism; and
   a vessel configured to airtightly accommodate said secondary side mechanism under a second pressure higher than the first pressure.

2. The vacuum processing apparatus according to claim 1, further comprising:
   a processing unit configured to convey said processing object with the wirelessly transferred electric power under control of said driving source, wherein
   said driving source is a controller accommodated in said vessel and configured to control a movement of said processing unit.

3. The vacuum processing apparatus according to claim 1, wherein
   said vacuum chamber includes a partition wall that defines an inside and an outside of said vacuum chamber, and
   said partition wall includes a transferring member provided at least at a position of said partition wall, through which said primary side mechanism and said secondary side mechanism are opposed to each other, said transferring member being configured to transfer energy of the wirelessly transferred electric power transferred from said primary side mechanism to said secondary side mechanism.

4. The vacuum processing apparatus according to claim 1, wherein said electric power supply mechanism is configured to induce a magnetic field to transfer the electric power from said primary side mechanism to said secondary side mechanism.

5. The vacuum processing apparatus according to claim 1, further comprising:
   a movable body integrally movable with said vessel, wherein
   said driving source is configured to drive said movable body.

6. The vacuum processing apparatus according to claim 5, wherein at least one of said primary side mechanism extends along a direction of movement of said movable body.

7. The vacuum processing apparatus according to claim 5, wherein a plurality of said primary side mechanisms are disposed intermittently along a direction of movement of said movable body.

8. The vacuum processing apparatus according to claim 7, wherein at least one of the plurality of said primary side mechanisms is disposed at a position corresponding to a home position of said movable body.

9. The vacuum processing apparatus according to claim 5, further comprising:
   a cooling mechanism provided at a home position of a conveyance path of said movable body, and including a cooling section configured to receive heat generated within said vessel and to dissipate the received heat outside the vacuum chamber.

10. A vacuum processing apparatus, comprising:
    a vacuum chamber for maintaining a first pressure lower than an atmospheric pressure;
    driving means for controlling movement of a processing object, said driving means being disposed in said vacuum chamber;

electric power supplying means, including primary side power supplying means disposed outside said vacuum chamber and secondary side power supplying means disposed in said vacuum chamber, for wirelessly transferring electric power from said primary side power supplying means to said driving means via said secondary side power supplying means; and a vessel for airtightly accommodating said secondary side mechanism under a second pressure higher than the first pressure.

11. A method of operating a vacuum processing apparatus, comprising:

maintaining a first pressure in a vacuum chamber lower than an atmospheric pressure;

providing electric power to a primary side mechanism disposed outside said vacuum chamber;

wirelessly transferring the electric power from said primary side mechanism to a driving source, the electric power being transferred to said driving source via a secondary side mechanism disposed in said vacuum chamber; and maintaining, in a vessel that is airtight, said secondary side mechanism under a second pressure higher than the first pressure.

* * * * *